(12) United States Patent
Miyauchi et al.

(10) Patent No.: US 8,089,734 B2
(45) Date of Patent: Jan. 3, 2012

(54) MAGNETORESISTIVE ELEMENT HAVING A PAIR OF SIDE SHIELDS

(75) Inventors: Daisuke Miyauchi, Tokyo (JP); Keita Kawamori, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 92 days.

(21) Appl. No.: 12/781,297

(22) Filed: May 17, 2010

(65) Prior Publication Data

US 2011/0279923 A1 Nov. 17, 2011

(51) Int. Cl.
*G11B 5/39* (2006.01)

(52) U.S. Cl. ........................................ 360/319

(58) Field of Classification Search ............................. None
See application file for complete search history.

(56) References Cited

U.S. PATENT DOCUMENTS

| | | | |
|---|---|---|---|
| 7,369,374 B2 * | 5/2008 | Gill et al. | 360/324.12 |
| 7,522,391 B2 * | 4/2009 | Freitag et al. | 360/324.12 |
| 7,639,456 B2 * | 12/2009 | Hong et al. | 360/324.1 |
| 7,712,206 B2 * | 5/2010 | Jiang et al. | 29/603.16 |
| 7,859,799 B2 * | 12/2010 | Watanabe et al. | 360/324.1 |
| 7,876,534 B2 * | 1/2011 | Chou et al. | 360/319 |
| 7,894,159 B2 * | 2/2011 | Lengsfield et al. | 360/125.03 |
| 2009/0034132 A1 | 2/2009 | Miyauchi et al. | |
| 2009/0135529 A1 | 5/2009 | Shimazawa et al. | |
| 2010/0027168 A1 | 2/2010 | Chou et al. | |
| 2011/0007429 A1 * | 1/2011 | Dimitrov et al. | 360/319 |

FOREIGN PATENT DOCUMENTS

JP A-2007-109807 4/2007

OTHER PUBLICATIONS

U.S. Appl. No. 12/461,976, filed Aug. 31, 2009 in the name of Miyauchi et al.

* cited by examiner

*Primary Examiner* — Mark Blouin
(74) *Attorney, Agent, or Firm* — Oliff & Berridge, PLC

(57) ABSTRACT

An MR element includes an MR stack disposed between first and second main shield portions, and a pair of side shields disposed on opposite sides of the MR stack in the track width direction. The first main shield portion includes a first exchange coupling shield layer that is exchange-coupled to a first antiferromagnetic layer. The second main shield portion includes a second exchange coupling shield layer that is exchange-coupled to a second antiferromagnetic layer. The MR stack includes a spacer layer, and first and second free layers with the spacer layer therebetween. The direction of magnetization of the first free layer is controlled by the first exchange coupling shield layer. The direction of magnetization of the second free layer is controlled by the second exchange coupling shield layer. Each side shield includes at least one shield-coupling magnetic layer that is in contact with and magnetically coupled to one of the first and second exchange coupling shield layers.

17 Claims, 13 Drawing Sheets

REALTED ART

MAGNETORESISTIVE ELEMENT HAVING A PAIR OF SIDE SHIELDS

BACKGROUND OF THE INVENTION

1. Field of the Invention

The present invention relates to a magnetoresistive element that is for use in, for example, a thin-film magnetic head, and has a pair of free layers and a pair of side shields.

2. Description of the Related Art

Recently, magnetic disk drives have been improved in areal recording density, and thin-film magnetic heads of improved performance have been demanded accordingly. Among the thin-film magnetic heads, a composite thin-film magnetic head has been used widely. The composite thin-film magnetic head has such a structure that a read head including a magnetoresistive element (hereinafter, also referred to as MR element) for reading and a write head including an induction-type electromagnetic transducer for writing are stacked on a substrate.

Examples of MR elements include a giant magnetoresistive (GMR) element utilizing a giant magnetoresistive effect and a tunneling magnetoresistive (TMR) element utilizing a tunneling magnetoresistive effect.

Read heads are required to have characteristics of high sensitivity and high output. As the read heads that satisfy such requirements, those incorporating spin-valve GMR elements or TMR elements have been mass-produced.

Spin-valve GMR elements and TMR elements each typically include a free layer, a pinned layer, a spacer layer disposed between the free layer and the pinned layer, and an antiferromagnetic layer disposed on a side of the pinned layer opposite from the spacer layer. The free layer is a ferromagnetic layer whose direction of magnetization changes in response to a signal magnetic field. The pinned layer is a ferromagnetic layer whose direction of magnetization is pinned. The antiferromagnetic layer is a layer that pins the direction of magnetization of the pinned layer by means of exchange coupling with the pinned layer. For spin-valve GMR elements, the spacer layer is a nonmagnetic conductive layer. For TMR elements, the spacer layer is a tunnel barrier layer.

Examples of the read head incorporating a GMR element include one having a current-in-plane (CIP) structure in which a current used for detecting a signal magnetic field (hereinafter referred to as a sense current) is fed in the direction parallel to the planes of the layers constituting the GMR element, and one having a current-perpendicular-to-plane (CPP) structure in which the sense current is fed in a direction intersecting the planes of the layers constituting the GMR element, such as the direction perpendicular to the planes of the layers constituting the GMR element.

The read head has a pair of shields with the MR element therebetween. The distance between the pair of shields is called a read gap length. Recently, with an increase in recording density, there have been increasing demands for a reduction in track width and a reduction in read gap length in read heads.

As one of MR elements that can achieve a reduction in read gap length, there has been proposed an MR element that includes a pair of ferromagnetic layers each functioning as a free layer, and a spacer layer disposed between the pair of ferromagnetic layers (such an MR element will hereinafter be referred to as an MR element of three-layer structure), as disclosed in U.S. Patent Application Publication No. 2009/0034132A1, U.S. Patent Application Publication No. 2009/0135529A1, and U.S. Patent Application Publication No. 2010/0027168A1, for example. In the MR element of three-layer structure, when the pair of ferromagnetic layers are subjected to no external magnetic field, they are magnetized in directions that are antiparallel to each other and parallel to the track width direction. The directions of magnetization of the pair of ferromagnetic layers change in response to an external magnetic field.

In the read head incorporating the MR element of three-layer structure, a bias magnetic field is applied to the pair of ferromagnetic layers. The bias magnetic field changes the directions of magnetization of the pair of ferromagnetic layers so that their directions of magnetization each form an angle of approximately 45 degrees with respect to the track width direction. This makes the relative angle between the directions of magnetization of the pair of ferromagnetic layers approximately 90 degrees. When a signal magnetic field sent from the recording medium is applied to the read head, the relative angle between the directions of magnetization of the pair of ferromagnetic layers changes, and consequently, the MR element changes in resistance. With such a read head, it is possible to detect the signal magnetic field by detecting the resistance of the MR element. The read head incorporating the MR element of three-layer structure allows a much greater reduction in read gap length as compared with a read head incorporating a conventional GMR element.

For the MR element of three-layer structure, one of methods for making the directions of magnetization of the pair of ferromagnetic layers antiparallel to each other when no external magnetic field is applied is to establish antiferromagnetic coupling between the pair of ferromagnetic layers via the spacer layer by the RKKY interaction.

Disadvantageously, however, this method imposes limitation on the material and thickness of the spacer layer so as to allow antiferromagnetic coupling between the pair of ferromagnetic layers. In addition, since this method limits the material of the spacer layer to nonmagnetic conductive materials, it is applicable to neither a TMR element which is expected to provide a high output, nor a GMR element of CPP structure of current-confined-path type which is an MR element that is also expected to provide a high output and whose spacer layer includes a current-transmitting portion and a current-blocking portion. The foregoing method further has the disadvantage that, even if it could be possible to make the directions of magnetization of the pair of ferromagnetic layers antiparallel to each other, it is difficult to make them parallel to the track width direction with reliability.

U.S. Patent Application Publication No. 2009/0135529A1 and U.S. Patent Application Publication No. 2010/0027168A1 each describe a method of controlling the directions of magnetization of a pair of free layers in an MR stack by using a pair of shields. The MR stack includes the pair of free layers and a spacer layer interposed between the pair of free layers. The pair of shields are provided so that the MR stack is interposed therebetween. According to this method, the pair of free layers in the MR stack are magnetically coupled to the pair of shields, and are thereby controlled so that their directions of magnetization are antiparallel to each other. Hereinafter, an MR element that is configured to include the foregoing MR stack and the pair of shields will be referred to as a shield-coupling MR element.

In order to increase the recording density, it is needed to reduce the read gap length and the track width as well. To reduce the track width, it is effective to reduce the dimension of the MR stack in the track width direction. However, there is a limit to the reduction of the dimension of the MR stack in the track width direction. It is therefore desired to introduce some technology that can reduce the effective track width for an identical dimension of the MR stack in the track width direction. One of such technologies is to provide a pair of side shield layers on opposite sides of the MR stack in the track width direction, as described in U.S. Patent Application Publication No. 2009/0034132 A1.

The inventors of this application then conceived providing a pair of side shield layers on opposite sides of the MR stack in the track width direction in a shield-coupling MR element, and prototyped such an MR element. As a result, it was found that the shield-coupling MR element having a pair of side shield layers can achieve reductions in read gap length and effective track width, and can thus provide improved recording density.

The configuration of the shield-coupling MR element with the pair of side shield layers described in U.S. Patent Application Publication No. 2009/0034132 A1, however, has room for improvement in the following respect. That is, each of the side shield layers has a predetermined dimension in the direction perpendicular to a medium facing surface, which is the surface facing the recording medium, of the thin-film magnetic head. This dimension is equal to, for example, the dimension of the MR stack in the direction perpendicular to the medium facing surface. Each of the side shield layers therefore has a relatively small volume. The pair of side shield layers described in U.S. Patent Application Publication No. 2009/0034132 A1 are magnetically isolated by insulating layers from a pair of shields that are arranged at the top and bottom of the MR stack, respectively. Thus, the side shield layers are relatively small in volume and are magnetically isolated. Consequently, such side shield layers can fail to provide a sufficient shielding function to absorb an excessive magnetic flux. In addition, the directions of magnetization of the side shield layers lack stability, which can make the MR element unstable in operation.

OBJECT AND SUMMARY OF THE INVENTION

It is an object of the present invention to provide a magnetoresistive element and a method of manufacturing the same, the magnetoresistive element including an MR stack and a pair of side shields disposed on opposite sides of the MR stack in the track width direction, the MR stack including a pair of free layers coupled to a pair of main shield portions, the magnetoresistive element achieving an improvement in the function of the pair of side shields, and to provide a thin-film magnetic head, a head assembly, and a magnetic recording device that each incorporate such a magnetoresistive element. While a detailed description will be given hereinafter, the present invention achieves the improvement in the function of the pair of side shields by magnetically coupling a magnetic layer included in each of the pair of side shields to a part of one of the main shield portions.

The magnetoresistive element of the present invention is intended to detect a magnetic signal written on a track of a recording medium. The magnetoresistive element of the present invention includes a first main shield portion, a second main shield portion, and an MR stack disposed between the first and second main shield portions. The first main shield portion, the MR stack, and the second main shield portion are arranged in a direction in which the track extends.

The first main shield portion includes: a first main shield layer; a first antiferromagnetic layer that is disposed between the first main shield layer and the MR stack; and a first exchange coupling shield layer that is disposed between the first antiferromagnetic layer and the MR stack and is exchange-coupled to the first antiferromagnetic layer. The second main shield portion includes: a second main shield layer; a second antiferromagnetic layer that is disposed between the second main shield layer and the MR stack; and a second exchange coupling shield layer that is disposed between the second antiferromagnetic layer and the MR stack and is exchange-coupled to the second antiferromagnetic layer. The MR stack includes: a spacer layer made of a nonmagnetic material; a first free layer disposed between the first exchange coupling shield layer and the spacer layer; and a second free layer disposed between the second exchange coupling shield layer and the spacer layer. The first free layer is magnetically coupled to the first exchange coupling shield layer, whereby the direction of magnetization of the first free layer is controlled. The second free layer is magnetically coupled to the second exchange coupling shield layer, whereby the direction of magnetization of the second free layer is controlled.

The magnetoresistive element of the present invention further includes a pair of side shields disposed on opposite sides of the MR stack in a track width direction, between the first main shield portion and the second main shield portion. Each of the pair of side shields includes at least one shield-coupling magnetic layer that is in contact with and magnetically coupled to one of the first and second exchange coupling shield layers.

In the magnetoresistive element of the present invention, the MR stack and the second main shield portion may be stacked in this order on the first main shield portion. In such a case, the magnetoresistive element may further include a pair of insulating layers disposed between the first exchange coupling shield layer and the pair of side shields. The at least one shield-coupling magnetic layer may be in contact with and magnetically coupled to the second exchange coupling shield layer. In such a case, top surfaces of the at least one shield-coupling magnetic layer and the MR stack may be flattened.

In the case where the top surfaces of the at least one shield-coupling magnetic layer and the MR stack are flattened as mentioned above, the magnetoresistive element may further include a pair of nonmagnetic layers that are disposed between the at least one shield-coupling magnetic layer and the pair of insulating layers. In such a case, the at least one shield-coupling magnetic layer may be made of NiFe, and the nonmagnetic layers may be made of a material selected from the group consisting of Cr, CrTi, and Ru. The ratio of the thickness of the shield-coupling magnetic layer to the total thickness of the shield-coupling magnetic layer and the nonmagnetic layer may be in the range of 13% to 87%.

In the case where the MR stack and the second main shield portion are stacked in this order on the first main shield portion, the magnetoresistive element of the present invention may further include a pair of insulating layers disposed between the second exchange coupling shield layer and the pair of side shields. The at least one shield-coupling magnetic layer may be in contact with and magnetically coupled to the first exchange coupling shield layer.

In the magnetoresistive element of the present invention, each of the pair of side shields may include a side shield middle layer that is made of a nonmagnetic conductive material, and first and second side shield magnetic layers that are antiferromagnetically exchange-coupled to each other via the side shield middle layer. One of the first and second side shield magnetic layers may be the at least one shield-coupling magnetic layer. In such a case, the MR stack and the second main shield portion may be stacked in this order on the first main shield portion. The magnetoresistive element may further include a pair of insulating layers disposed between the first exchange coupling shield layer and the pair of side shields. The side shield middle layer and the second side shield magnetic layer may be stacked in this order on the first side shield magnetic layer. The second side shield magnetic layer may be the at least one shield-coupling magnetic layer, and may be in contact with and magnetically coupled to the second exchange coupling shield layer.

In the magnetoresistive element of the present invention, each of the pair of side shields may include first and second side shield magnetic layers, and a side shield insulating layer that is disposed between the first and second side shield magnetic layers. Both of the first and second side shield magnetic layers may be the at least one shield-coupling magnetic layer. In such a case, the first side shield magnetic layer is in contact with and magnetically coupled to the first exchange coupling shield layer, while the second side shield magnetic layer is in contact with and magnetically coupled to the second exchange coupling shield layer.

In the magnetoresistive element of the present invention, one of the first and second exchange coupling shield layers may include a shield middle layer that is made of a nonmagnetic conductive material, and two ferromagnetic layers that are antiferromagnetically exchange-coupled to each other via the shield middle layer. The other of the first and second exchange coupling shield layers may include one or more ferromagnetic layers and no shield middle layer.

A thin-film magnetic head of the present invention includes the magnetoresistive element of the present invention and has a medium facing surface that faces the recording medium. The magnetoresistive element is disposed near the medium facing surface.

A head assembly of the present invention includes a slider, and a supporter that flexibly supports the slider. The slider includes the thin-film magnetic head of the present invention and is disposed to face the recording medium.

A magnetic recording device of the present invention includes the thin-film magnetic head of the present invention, the recording medium, and a positioning device that supports the thin-film magnetic head and positions the thin-film magnetic head with respect to the recording medium.

A method of manufacturing the magnetoresistive element of the present invention includes the steps of forming the first main shield portion; forming the MR stack and the pair of side shields after the formation of the first main shield portion; and forming the second main shield portion after the formation of the MR stack and the pair of side shields.

In the method of manufacturing the magnetoresistive element of the present invention, the magnetoresistive element may further include a pair of insulating layers disposed between the first exchange coupling shield layer and the pair of side shields. The at least one shield-coupling magnetic layer may be in contact with and magnetically coupled to the second exchange coupling shield layer. In such a case, the step of forming the MR stack and the pair of side shields may include the step of forming the pair of insulating layers and the step of flattening the top surfaces of the at least one shield-coupling magnetic layer and the MR stack. In such a case, the magnetoresistive element may further include a pair of nonmagnetic layers disposed between the at least one shield-coupling magnetic layer and the pair of insulating layers. The step of forming the MR stack and the pair of side shields may further include the step of forming the pair of nonmagnetic layers.

According to the magnetoresistive element and the method of manufacturing the same, and the thin-film magnetic head, the head assembly and the magnetic recording device that each include the magnetoresistive element, each of the pair of side shields includes at least one shield-coupling magnetic layer. The at least one shield-coupling magnetic layer is in contact with and magnetically coupled to one of the first and second exchange coupling shield layers. According to the present invention, it is thereby possible to improve the function of the pair of side shields as compared with a case where the pair of side shields were magnetically isolated from the first and second exchange coupling shield layers.

Other and further objects, features and advantages of the present invention will appear more fully from the following description.

DETAILED DESCRIPTION OF THE PREFERRED EMBODIMENTS

First Embodiment

Figure 11:
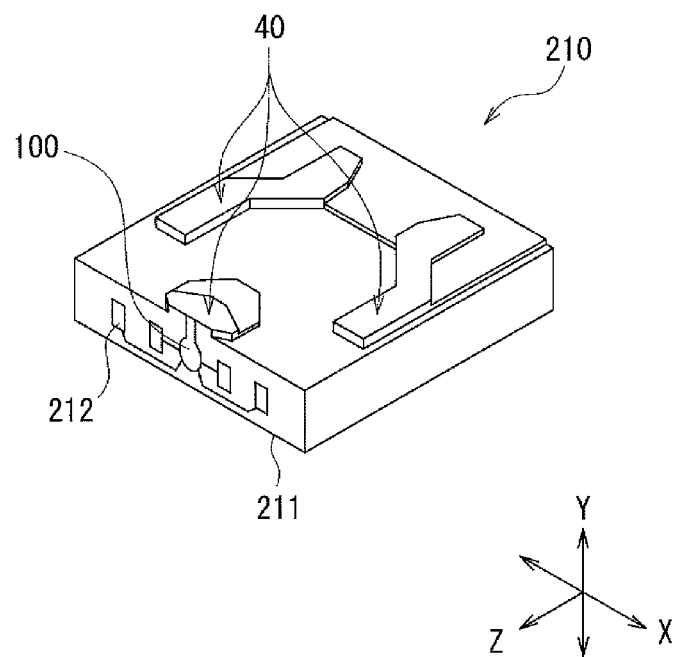
FIG. 11 is a perspective view of a slider including the magnetic head according to the first embodiment of the invention.

Embodiment of the present invention will now be described in detail with reference to the drawings. First, with reference to FIG. 11, a description will be given of a slider 210 including a thin-film magnetic head (hereinafter, simply referred to as a magnetic head) according to a first embodiment of the invention. The magnetic head according to the present embodiment is for use in perpendicular magnetic recording. In a magnetic recording device, the slider 210 is disposed to face a circular-plate-shaped recording medium (a magnetic disk) that is driven to rotate. The recording medium has a plurality of tracks that are arranged concentrically. The tracks are the areas where magnetic signals are to be written. In FIG. 11, the X direction is a direction across the tracks of the recording medium. The Y direction is a direction perpendicular to the surface of the recording medium. The Z direction is the direction of travel of the recording medium as seen from the slider 210, and is the direction in which the tracks extend. The X, Y, and Z directions are orthogonal to one another.

The slider 210 has a base body 211. The base body 211 is nearly hexahedron-shaped. One of the six surfaces of the base body 211 is designed to face the surface of the recording medium. At this one of the six surfaces, there is formed a medium facing surface 40 to face the recording medium. When the recording medium rotates and travels in the Z direction, an airflow passing between the recording medium and the slider 210 causes a lift below the slider 210 in the Y direction of FIG. 11. The lift causes the slider 210 to fly over the surface of the recording medium. The magnetic head 100 according to the present embodiment is formed near the air-outflow-side end (the end in the Z direction) of the slider 210. A plurality of terminals 212 are also provided at the air-outflow-side end of the slider 210.

A head assembly according to the present embodiment will now be described with reference to FIG. 12. The head assembly according to the present embodiment includes the slider 210 shown in FIG. 11 and a supporter that flexibly supports the slider 210. Forms of the head assembly include a head gimbal assembly and a head arm assembly described below.

A description will initially be given of the head gimbal assembly 220. The head gimbal assembly 220 includes the slider 210, and a suspension 221 serving as the supporter that flexibly supports the slider 210. The suspension 221 includes: a plate-spring-shaped load beam 222 formed of, e.g., stainless steel; a flexure 223 to which the slider 210 is joined, the flexure 223 being provided at an end of the load beam 222 and giving an appropriate degree of freedom to the slider 210; and a base plate 224 provided at the other end of the load beam 222. The base plate 224 is configured to be attached to an arm 230 of an actuator for moving the slider 210 along the X direction across the tracks of the recording medium 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

Figure 12:
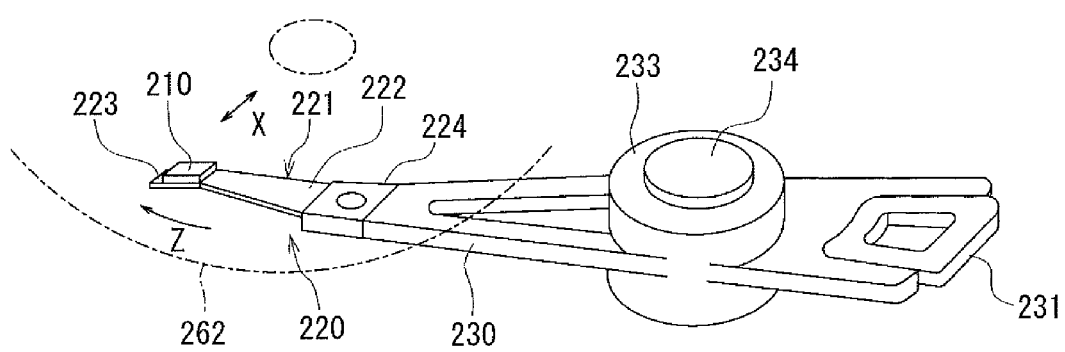
FIG. 12 is a perspective view of a head arm assembly according to the first embodiment of the invention.

FIG. 12 shows the head arm assembly according to the present embodiment. In the head arm assembly, the head gimbal assembly 220 is attached to an end of the arm 230. A coil 231 that forms part of the voice coil motor is fixed to the other end of the arm 230. A bearing 233 is provided in the middle of the arm 230. The bearing 233 is attached to a shaft 234 for rotatably supporting the arm 230.

Figure 13:
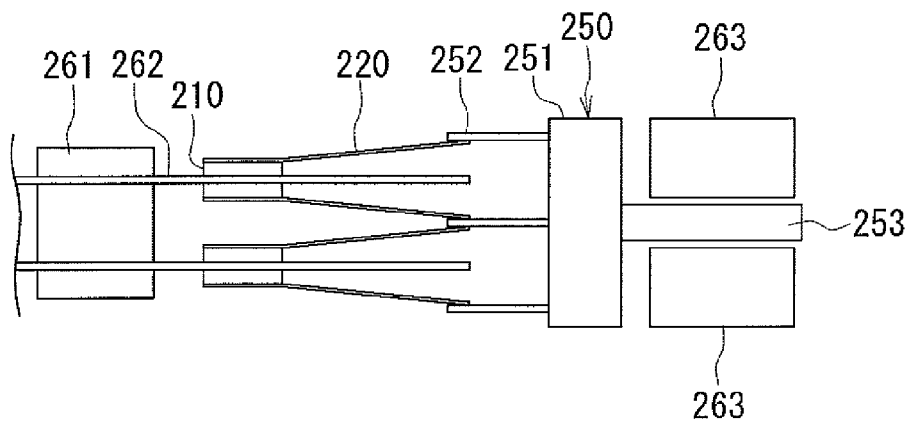
FIG. 13 is an explanatory diagram illustrating the main part of a magnetic recording device according to the first embodiment of the invention.
Figure 14:
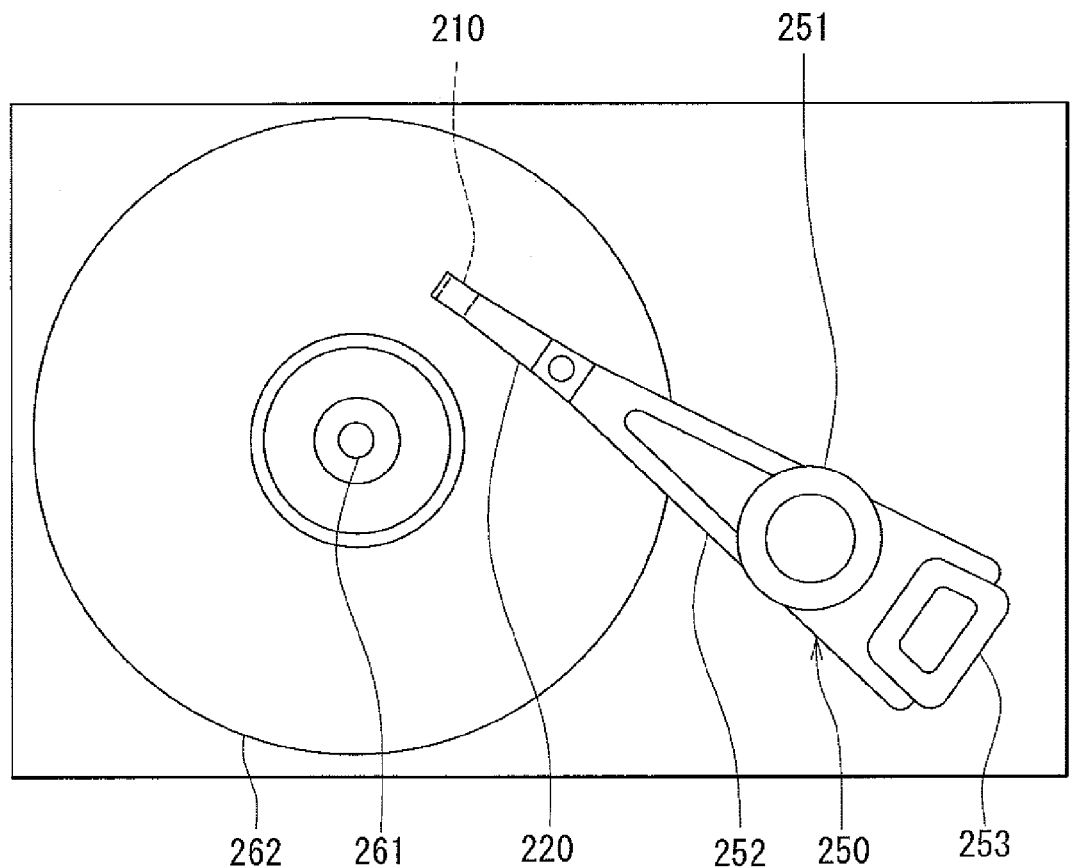
FIG. 14 is a plan view of the magnetic recording device according to the first embodiment of the invention.

Reference is now made to FIG. 13 and FIG. 14 to describe an example of the head stack assembly and a magnetic recording device according to the present embodiment. FIG. 13 is an explanatory diagram showing the main part of the magnetic recording device. FIG. 14 is a plan view of the magnetic recording device. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 that is part of the voice coil motor is mounted on a side of the carriage 251 opposite from the arms 252. The head stack assembly 250 is installed in the magnetic recording device. The magnetic recording device includes a plurality of recording media 262 mounted on a spindle motor 261. Two sliders 210 are allocated to each recording medium 262 such that the two sliders 210 are opposed to each other with the recording medium 262 interposed therebetween. The voice coil motor includes permanent magnets 263 arranged to be opposed to each other with the coil 253 of the head stack assembly 250 interposed therebetween. The actuator and the head stack assembly 250 except the sliders 210 support the sliders 210 and position them with respect to the recording media 262.

In the magnetic recording device according to the present embodiment, the actuator moves the slider 210 across the tracks of the recording medium 262 and positions the slider 210 with respect to the recording medium 262. The magnetic head included in the slider 210 writes data on the recording medium 262 with the write head, and reads data stored on the recording medium 262 with the read head.

Figure 6:
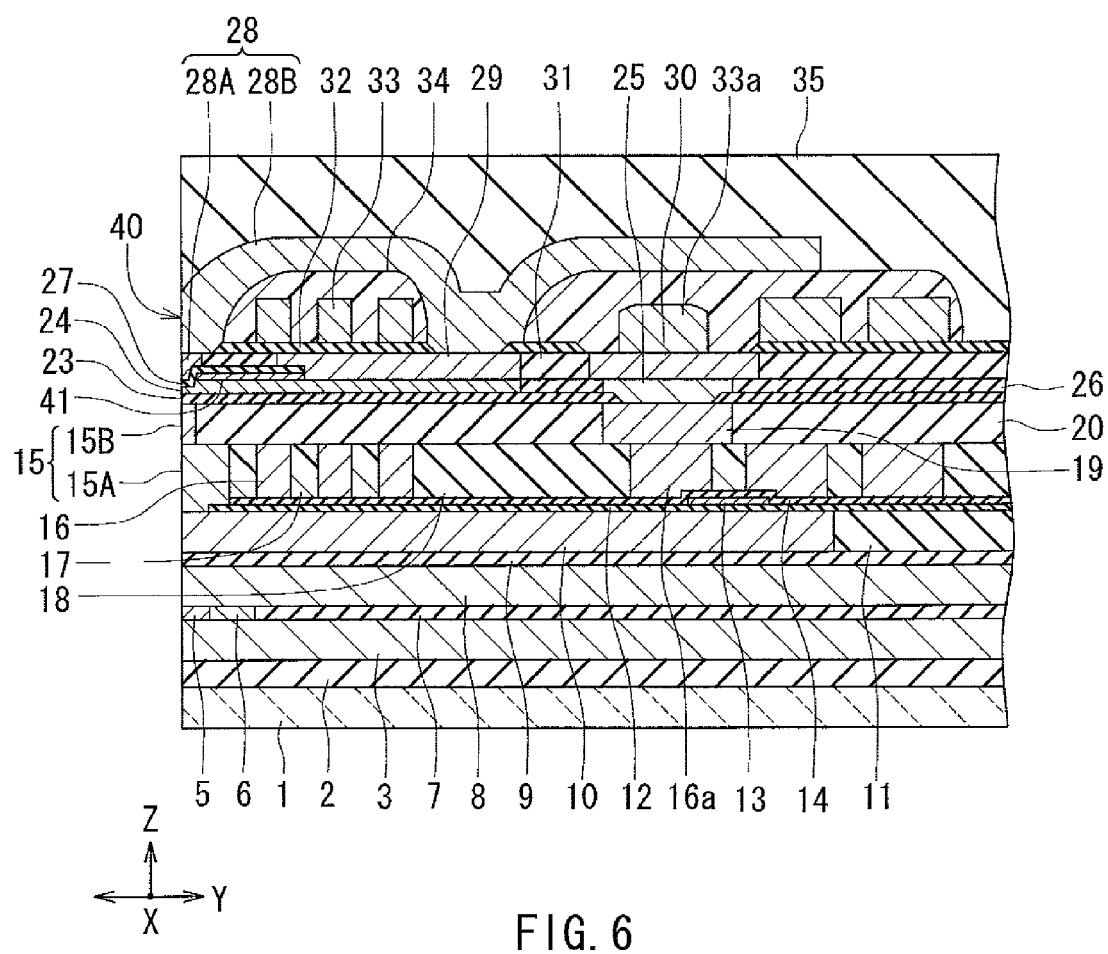
FIG. 6 is a cross-sectional view showing the configuration of a magnetic head according to the first embodiment of the invention.
Figure 7:
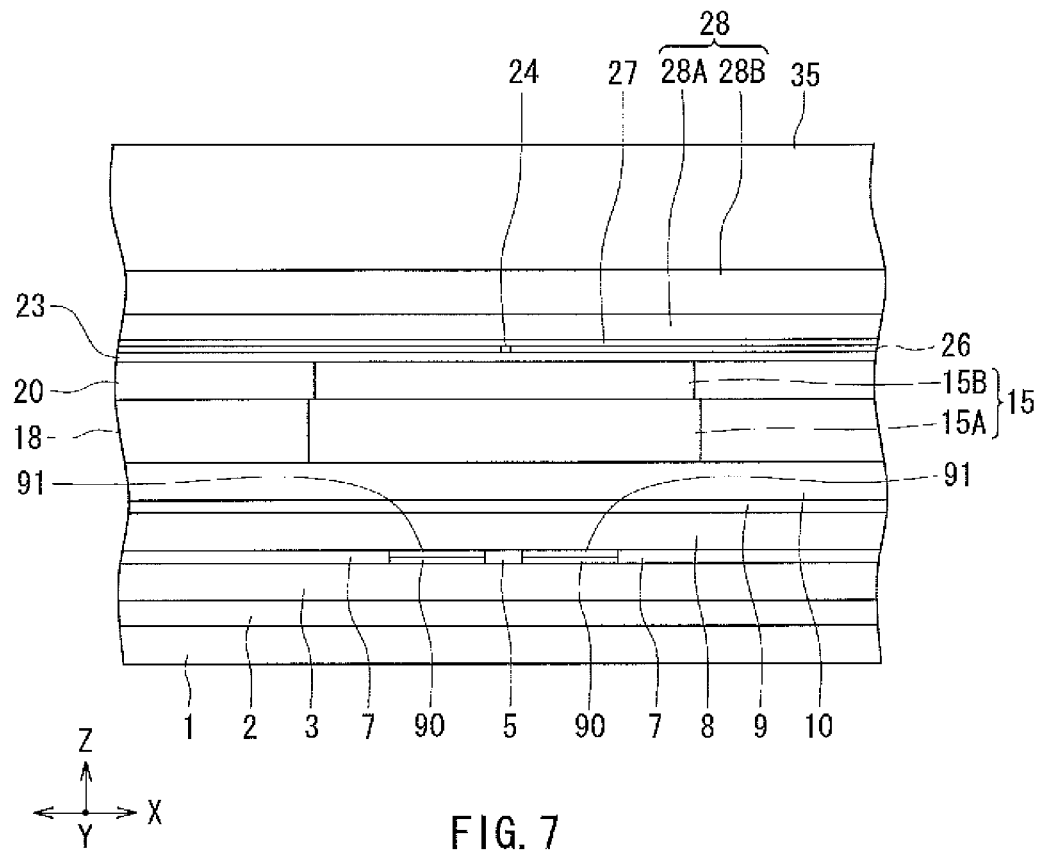
FIG. 7 is a front view showing the medium facing surface of the magnetic head according to the first embodiment of the invention.

Reference is now made to FIG. 6 and FIG. 7 to describe the configuration of the magnetic head according to the present embodiment. FIG. 6 is a cross-sectional view showing the configuration of the magnetic head. FIG. 7 is a front view showing the medium facing surface of the magnetic head. Note that FIG. 6 shows a cross section perpendicular to the medium facing surface and the top surface of the substrate. The X, Y, and Z directions shown in FIG. 11 are also shown in FIG. 6 and FIG. 7. In FIG. 6, the X direction is orthogonal to the Y and Z directions. In FIG. 7, the Y direction is orthogonal to the X and Z directions.

As shown in FIG. 6, the magnetic head according to the present embodiment has the medium facing surface 40 facing the recording medium. As shown in FIG. 6 and FIG. 7, the magnetic head includes: a substrate 1 made of a ceramic material such as aluminum oxide-titanium carbide ($Al_2O_3$—TiC); an insulating layer 2 made of an insulating material such as alumina ($Al_2O_3$) and disposed on the substrate 1; a first main shield portion 3 disposed on the insulating layer 2; and an MR stack 5 disposed on the first main shield portion 3.

The MR stack 5 has a bottom surface in contact with the first main shield portion 3, a top surface opposite to the bottom surface, a front end face located in the medium facing surface 40, a rear end face opposite to the front end face, and two side surfaces located on opposite sides in the track width direction (X direction of FIG. 7).

The magnetic head further includes a pair of nonmagnetic layers 90 located on opposite sides of the MR stack 5 in the track width direction, and a pair of side shields 91 located on opposite sides of the MR stack 5 in the track width direction. The pair of nonmagnetic layers 90 are disposed over the first main shield portion 3 with not-shown insulating layers respectively interposed therebetween. The pair of side shields 91 are disposed on the pair of nonmagnetic layers 90. The pair of nonmagnetic layers 90 and the pair of side shields 91 adjoin the two side surfaces of the MR stack 5 via the not-shown insulating layers, respectively. The pair of nonmagnetic layers 90 and the pair of side shields 91 have their respective front end faces located in the medium facing surface 40 and their respective rear end faces opposite to the front end faces.

The magnetic head further includes a bias magnetic field applying layer 6 disposed over the first main shield portion 3 with a not-shown insulating layer interposed therebetween. The bias magnetic field applying layer 6 adjoins the rear end faces of the MR stack 5, the pair of nonmagnetic layers 90 and the pair of side shields 91 via the not-shown insulating layer. The magnetic head further includes an insulating refill layer 7 disposed around the MR stack 5, the nonmagnetic layers 90, the side shields 91, and the bias magnetic field applying layer 6.

The magnetic head further includes a second main shield portion 8 disposed over the MR stack 5, the side shields 91, the bias magnetic field applying layer 6 and the insulating refill layer 7, and a separating layer 9 made of a nonmagnetic material such as alumina and disposed on the second main shield portion 8.

The parts from the first main shield portion 3 to the second main shield portion 8 constitute a magnetoresistive element (hereinafter referred to as MR element) according to the present embodiment. The MR element constitutes the read head of the magnetic head.

The magnetic head further includes a magnetic layer 10 made of a magnetic material and disposed on the separating layer 9, and an insulating layer 11 made of an insulating material such as alumina and disposed around the magnetic layer 10. The magnetic layer 10 has an end face located in the medium facing surface 40. The magnetic layer 10 and the insulating layer 11 are flattened at the top.

The magnetic head further includes an insulating film 12 disposed over the magnetic layer 10 and the insulating layer 11, a heater 13 disposed on the insulating film 12, and an insulating film 14 disposed over the insulating film 12 and the heater 13 so that the heater 13 is interposed between the insulating films 12 and 14. The function and material of the heater 13 will be described later. The insulating films 12 and 14 are each made of an insulating material such as alumina.

The magnetic head further includes a first write shield 15 disposed on the magnetic layer 10. The first write shield 15 includes a first layer 15A disposed on the magnetic layer 10, and a second layer 15B disposed on the first layer 15A. The first layer 15A and the second layer 15B are each made of a magnetic material. The first layer 15A and the second layer 15B have their respective end faces located in the medium facing surface 40. In the example shown in FIG. 6, the second layer 15B has a length smaller than that of the first layer 15A in the direction perpendicular to the medium facing surface 40 (Y direction of FIG. 6). However, the length of the second layer 15B in the direction perpendicular to the medium facing surface 40 may be equal to or greater than that of the first layer 15A in the direction perpendicular to the medium facing surface 40.

The magnetic head further includes a coil 16 made of a conductive material and disposed on the insulating film 14, an insulating layer 17 that fills the space between the coil 16 and the first layer 15A and the space between every adjacent turns of the coil 16, and an insulating layer 18 disposed around the first layer 15A, the coil 16 and the insulating layer 17. The coil 16 is planar spiral-shaped. The coil 16 includes a connecting portion 16a which is a portion near the inner end of the coil 16 and connected to another coil described later. The insulating layer 17 is made of photoresist, for example. The insulating layer 18 is made of alumina, for example. The first layer 15A, the coil 16, the insulating layer 17, and the insulating layer 18 are flattened at the top.

The magnetic head further includes a connecting layer 19 made of a conductive material and disposed on the connecting portion 16a, and an insulating layer 20 made of an insulating material such as alumina and disposed around the second layer 15B and the connecting layer 19. The connecting layer 19 may be made of the same material as that of the second layer 15B. The second layer 15B, the connecting layer 19, and the insulating layer 20 are flattened at the top.

The magnetic head further includes a first gap layer 23 disposed over the second layer 15B, the connecting layer 19, and the insulating layer 20. The first gap layer 23 has an opening formed in the area corresponding to the top surface of the connecting layer 19. The first gap layer 23 is made of a nonmagnetic insulating material such as alumina.

The magnetic head further includes a pole layer 24 made of a magnetic material and disposed on the first gap layer 23, a connecting layer 25 made of a conductive material and disposed on the connecting layer 19, and an insulating layer 26 made of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be made of the same material as that of the pole layer 24.

The magnetic head further includes a nonmagnetic layer 41 made of a nonmagnetic material and disposed on part of the top surface of the pole layer 24. The nonmagnetic layer 41 is made of an inorganic insulating material or a metal material, for example. Examples of the inorganic insulating material to be used for the nonmagnetic layer 41 include alumina and $SiO_2$. Examples of the metal material to be used for the nonmagnetic layer 41 include Ru and Ti.

The magnetic head further includes a second gap layer 27 disposed over a part of the pole layer 24 and the nonmagnetic layer 41. A part of the top surface of the pole layer 24 away from the medium facing surface 40 and the top surface of the connecting layer 25 are not covered with the nonmagnetic layer 41 and the second gap layer 27. The second gap layer 27 is made of a nonmagnetic material such as alumina.

The magnetic head further includes a second write shield 28 disposed on the second gap layer 27. The second write shield 28 includes a first layer 28A disposed to adjoin the second gap layer 27, and a second layer 28B disposed on a side of the first layer 28A opposite from the second gap layer 27 and connected to the first layer 28A. The first layer 28A and the second layer 28B are each made of a magnetic material. The first layer 28A and the second layer 28B have their respective end faces located in the medium facing surface 40.

The magnetic head further includes a yoke layer 29 made of a magnetic material and disposed on a part of the pole layer 24 away from the medium facing surface 40, a connecting layer 30 made of a conductive material and disposed on the connecting layer 25, and an insulating layer 31 made of an insulating material such as alumina and disposed around the first layer 28A, the yoke layer 29 and the connecting layer 30. The yoke layer 29 and the connecting layer 30 may be made of the same material as that of the first layer 28A. The first layer 28A, the yoke layer 29, the connecting layer 30, and the insulating layer 31 are flattened at the top.

The magnetic head further includes an insulating layer 32 made of an insulating material such as alumina and disposed on the yoke layer 29 and the insulating layer 31. The insulating layer 32 has an opening for exposing the top surface of the first layer 28A, an opening for exposing a part of the top surface of the yoke layer 29 near an end thereof farther from the medium facing surface 40, and an opening for exposing the top surface of the connecting layer 30.

The magnetic head further includes a coil 33 made of a conductive material and disposed on the insulating layer 32. The coil 33 is planar spiral-shaped. The coil 33 includes a connecting portion 33a which is a portion near the inner end of the coil 33 and connected to the connecting portion 16a of the coil 16. The connecting portion 33a is connected to the connecting layer 30, and is connected to the connecting portion 16a via the connecting layers 19, 25, and 30.

The magnetic head further includes an insulating layer 34 disposed to cover the coil 33. The insulating layer 34 is made of photoresist, for example. The second layer 28B of the second write shield 28 is disposed over the first layer 28A, the yoke layer 29 and the insulating layer 34, and connects the first layer 28A and the yoke layer 29 to each other.

The magnetic head further includes an overcoat layer 35 made of an insulating material such as alumina and disposed to cover the second layer 28B. The parts from the magnetic layer 10 to the second layer 28B constitute the write head. The base body 211 of FIG. 11 is mainly composed of the substrate 1 and the overcoat layer 35 of FIG. 6.

As has been described, the magnetic head has the medium facing surface 40 facing the recording medium, and includes the read head and the write head. The read head and the write head are stacked on the substrate 1. The read head is disposed backward along the direction of travel of the recording medium (Z direction) (in other words, disposed closer to the air-inflow end of the slider), while the write head is disposed forward along the direction of travel of the recording medium (Z direction) (in other words, disposed closer to the air-outflow end of the slider). The magnetic head writes data on the recording medium with the write head, and reads data stored on the recording medium with the read head.

The read head is composed of the MR element according to the present embodiment. The MR element includes the MR stack 5. The MR stack 5 is either a TMR element or a GMR element of the CPP structure. A sense current is fed to the MR stack 5 in a direction intersecting the planes of layers constituting the MR stack 5, such as the direction perpendicular to the planes of the layers constituting the MR stack 5. The MR stack 5 changes in resistance in response to an external magnetic field, that is, a signal magnetic field sent from the recording medium, the signal magnetic field corresponding to the magnetic signal written on a track of the recording medium. The resistance of the MR stack 5 can be determined from the sense current. It is thus possible, with the read head, to read data stored on the recording medium, that is, the magnetic signal written on the track of the recording medium. The configuration of the MR element will be described in detail later.

The write head includes the magnetic layer 10, the first write shield 15, the coil 16, the first gap layer 23, the pole layer 24, the nonmagnetic layer 41, the second gap layer 27, the second write shield 28, the yoke layer 29, and the coil 33. The first write shield 15 is located closer to the substrate 1 than is the second write shield 28. The pole layer 24 is located closer to the substrate 1 than is the second write shield 28.

The coils 16 and 33 produce a magnetic field that corresponds to data to be written on the recording medium. The pole layer 24 has an end face located in the medium facing surface 40, allows a magnetic flux corresponding to the magnetic field produced by the coils 16 and 33 to pass, and produces a write magnetic field to be used for writing the data on the recording medium by means of the perpendicular magnetic recording system.

The first write shield 15 is made of a magnetic material, and has an end face located in the medium facing surface 40 at a position backward of the end face of the pole layer 24 along the direction of travel of the recording medium (Z direction). The first gap layer 23 is made of a nonmagnetic material, has an end face located in the medium facing surface 40, and is disposed between the first write shield 15 and the pole layer 24. In the present embodiment, the first write shield 15 includes the first layer 15A disposed on the magnetic layer 10 and the second layer 15B disposed on the first layer 15A. Part of the coil 16 is located on a side of the first layer 15A so as to pass through the space between the magnetic layer 10 and the pole layer 24.

The magnetic layer 10 has the function of returning a magnetic flux that has been generated from the end face of the pole layer 24 and has magnetized the recording medium. FIG. 6 shows an example where the magnetic layer 10 has an end face located in the medium facing surface 40. Alternatively, the magnetic layer 10 may have an end face that is closer to the medium facing surface 40 and located at a distance from the medium facing surface 40, since the magnetic layer 10 is connected to the first write shield 15 having an end face located in the medium facing surface 40.

In the medium facing surface 40, the end face of the first write shield 15 (the end face of the second layer 15B) is located backward of the end face of the pole layer 24 along the direction of travel of the recording medium (Z direction) (in other words, located closer to the air-inflow end of the slider) with a predetermined small distance provided therebetween by the first gap layer 23. The distance between the end face of the pole layer 24 and the end face of the first write shield 15 in the medium facing surface 40 is preferably in the range of 0.05 to 0.7 μm, or more preferably in the range of 0.1 to 0.3 μm.

The first write shield 15 takes in a magnetic flux that is generated from the end face of the pole layer 24 located in the medium facing surface 40 and that expands in directions other than the direction perpendicular to the plane of the recording medium, and thereby prevents the flux from reaching the recording medium. It is thereby possible to improve the recording density.

The second write shield 28 is made of a magnetic material, and has an end face located in the medium facing surface 40 at a position forward of the end face of the pole layer 24 along the direction of travel of the recording medium (Z direction). The second gap layer 27 is made of a nonmagnetic material, has an end face located in the medium facing surface 40, and is disposed between the second write shield 28 and the pole layer 24. In the present embodiment, the second write shield 28 includes the first layer 28A disposed to adjoin the second gap layer 27, and the second layer 28B disposed on a side of the first layer 28A opposite from the second gap layer 27 and connected to the first layer 28A. Part of the coil 33 is arranged to pass through the space surrounded by the pole layer 24 and the second write shield 28. The second write shield 28 is connected to a part of the yoke layer 29 away from the medium facing surface 40. The second write shield 28 is thus connected to a part of the pole layer 24 away from the medium facing surface 40 via the yoke layer 29. The pole layer 24, the second write shield 28, and the yoke layer 29 form a magnetic path that passes a magnetic flux corresponding to the magnetic field produced by the coil 33.

In the medium facing surface 40, the end face of the second write shield 28 (the end face of the first layer 28A) is located forward of the end face of the pole layer 24 along the direction of travel of the recording medium (Z direction) (in other words, located closer to the air-outflow end of the slider) with a predetermined small distance provided therebetween by the second gap layer 27. The distance between the end face of the pole layer 24 and the end face of the second write shield 28 in the medium facing surface 40 is preferably equal to or smaller than 200 nm, or more preferably in the range of 25 to 50 nm, so that the second write shield 28 can fully exhibit its shield function.

The position of the end of a bit pattern to be written on the recording medium depends on the position of an end of the pole layer 24 in the medium facing surface 40, the end being closer to the second gap layer 27. The second write shield 28 takes in a magnetic flux that is generated from the end face of the pole layer 24 located in the medium facing surface 40 and that expands in directions other than the direction perpendicular to the plane of the recording medium, and thereby prevents the flux from reaching the recording medium. It is thereby possible to improve the recording density. The second write shield 28 also takes in a disturbance magnetic field that is applied to the magnetic head from the outside thereof. It is thereby possible to prevent erroneous writing on the recording medium caused by the disturbance magnetic field intensively taken into the pole layer 24. The second write shield 28 also has the function of returning a magnetic flux that has been generated from the end face of the pole layer 24 and has magnetized the recording medium.

FIG. 6 shows an example where neither the magnetic layer 10 nor the first write shield 15 is connected to the pole layer 24. Nevertheless, the magnetic layer 10 may be connected to a part of the pole layer 24 away from the medium facing surface 40. The coil 16 is not an essential component of the write head and can be dispensed with. In the example shown in FIG. 6, the yoke layer 29 is disposed on the pole layer 24, that is, disposed forward of the pole layer 24 along the direction of travel of the recording medium (Z direction) (in other words, disposed closer to the air-outflow end of the slider). Alternatively, the yoke layer 29 may be disposed below the pole layer 24, that is, backward of the pole layer 24 along the direction of travel of the recording medium (Z direction) (in other words, closer to the air-inflow end of the slider).

The heater 13 is provided for heating the components of the write head including the pole layer 24 so as to control the distance between the recording medium and the end face of the pole layer 24 located in the medium facing surface 40. Two not-shown leads are connected to the heater 13. The heater 13 is formed of an NiCr film or a layered film composed of a Ta film, an NiCu film and a Ta film, for example. The heater 13 generates heat by being energized through the two leads, and thereby heats the components of the write head. As a result, the components of the write head expand and the end face of the pole layer 24 located in the medium facing surface 40 thereby gets closer to the recording medium.

While FIG. 6 and FIG. 7 show a write head for use in the perpendicular magnetic recording system, the write head of the present embodiment may be one for use in the longitudinal magnetic recording system.

A method of manufacturing the magnetic head according to the present embodiment will now be outlined. In the method of manufacturing the magnetic head according to the embodiment, components of a plurality of magnetic heads are initially formed on a single substrate (wafer) to fabricate a substructure that includes a plurality of rows of pre-slider portions, the pre-slider portions being intended to become individual sliders later. Next, the substructure is cut into a slider aggregate that includes a row of pre-slider portions. Next, a surface formed in the slider aggregate by cutting the substructure is polished into the medium facing surfaces 40 of the pre-slider portions included in the slider aggregate. Next, flying rails are formed in the medium facing surfaces 40. Next, the slider aggregate is cut so as to separate the plurality of pre-slider portions from one another. This forms a plurality of sliders including their respective magnetic heads.

Figure 1:
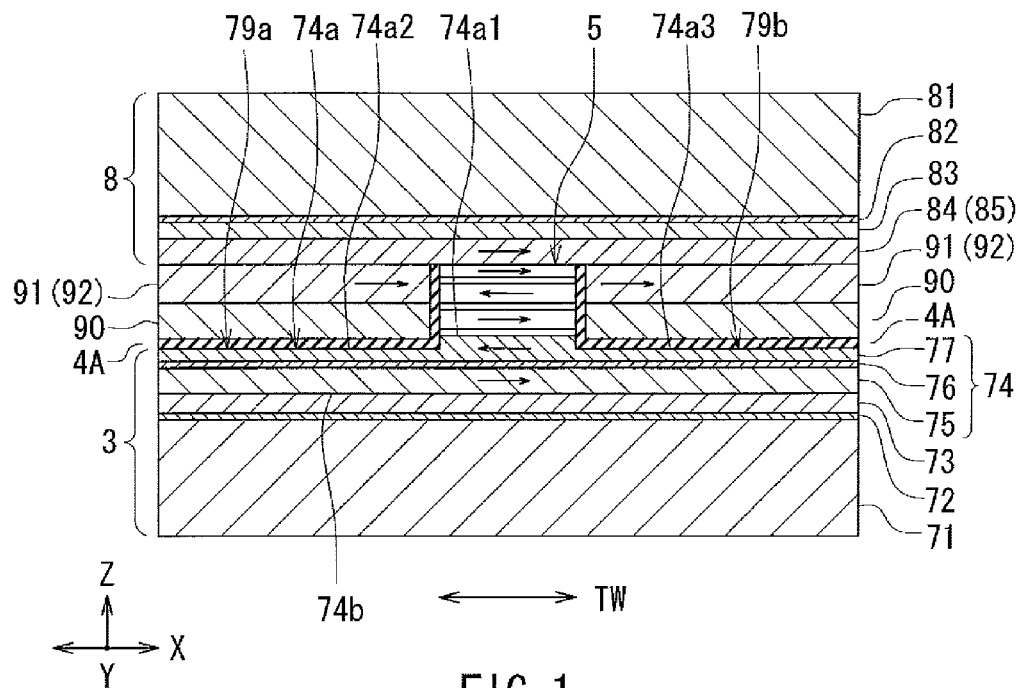
FIG. 1 is a cross-sectional view showing a cross section of a magnetoresistive element according to a first embodiment of the invention parallel to the medium facing surface.
Figure 2:
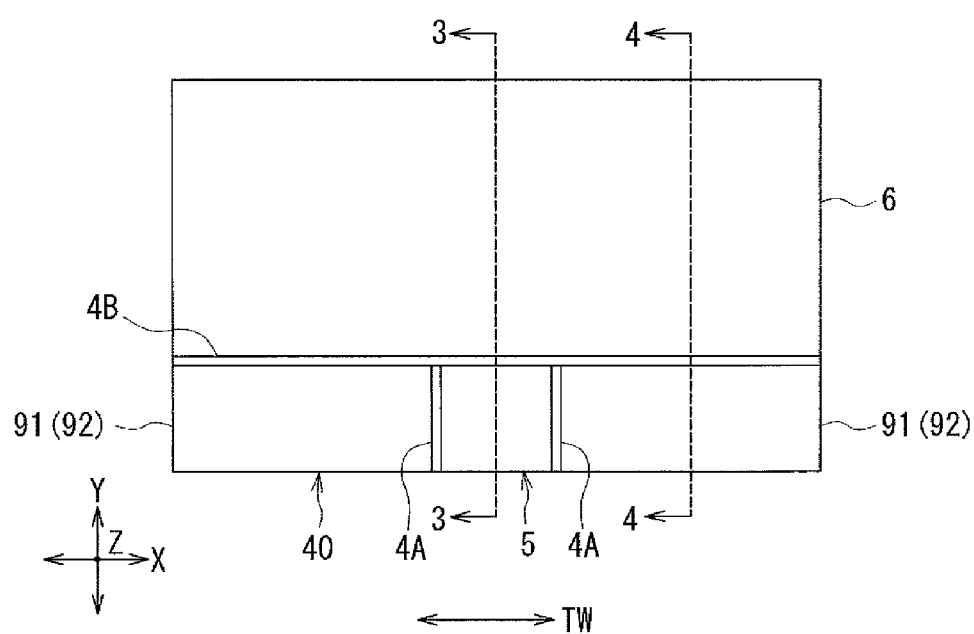
FIG. 2 is a plan view showing the main part of the magnetoresistive element shown in FIG. 1.
Figure 3:
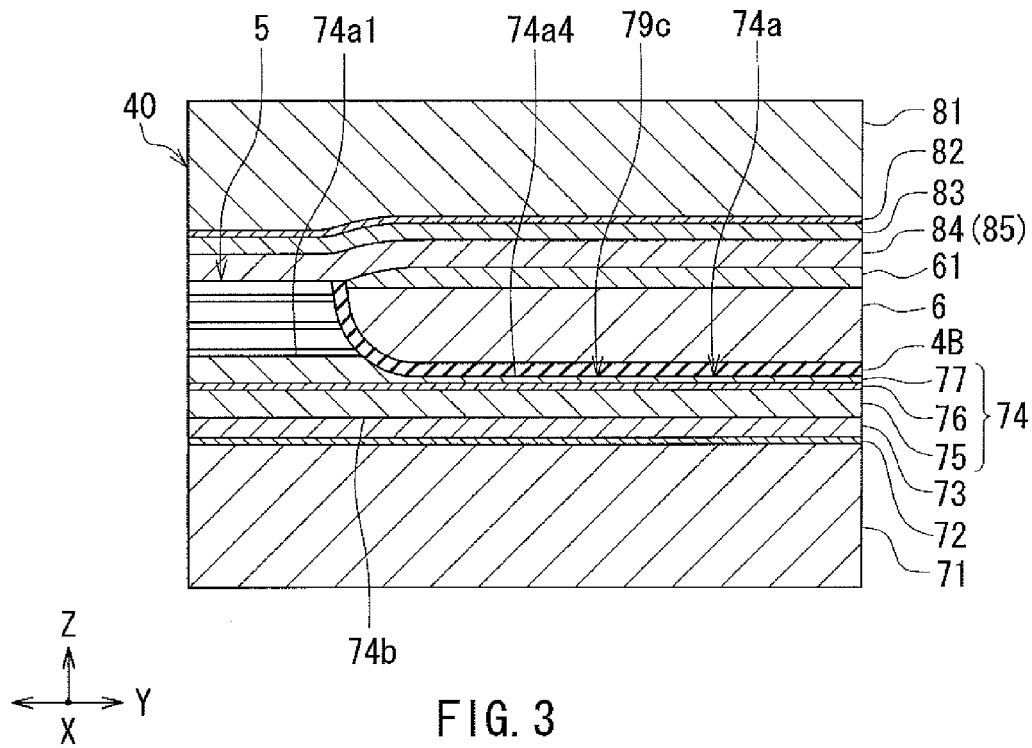
FIG. 3 is a cross-sectional view of the magnetoresistive element at the position of the line 3-3 shown in FIG. 2.
Figure 4:
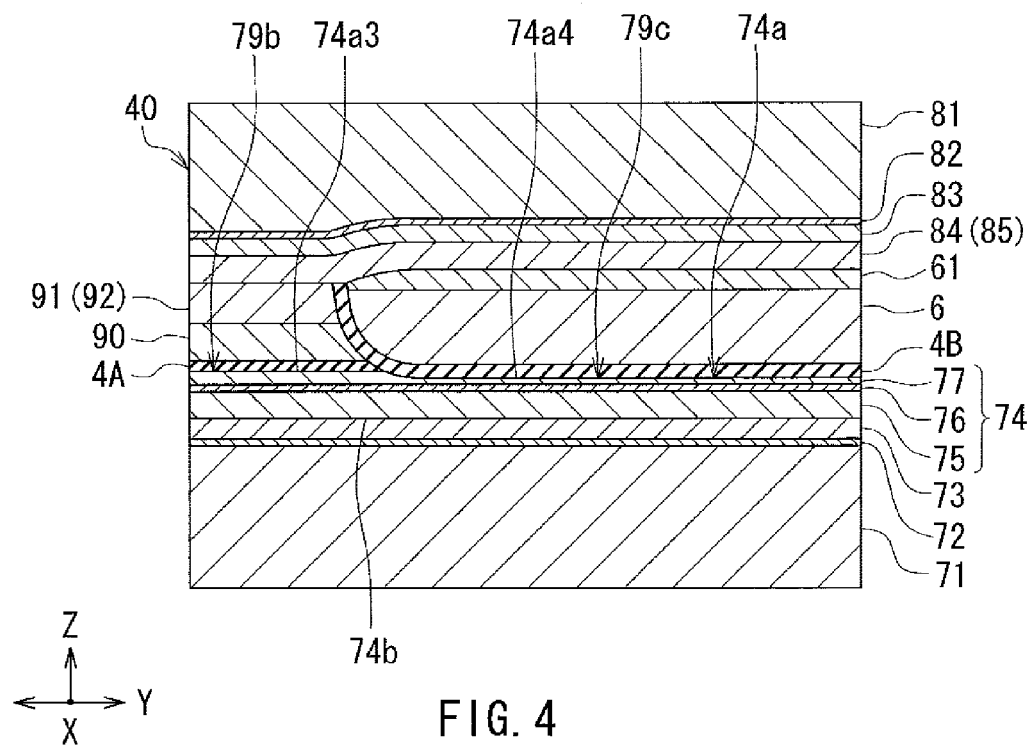
FIG. 4 is a cross-sectional view of the magnetoresistive element at the position of the line 4-4 shown in FIG. 2.
Figure 5:
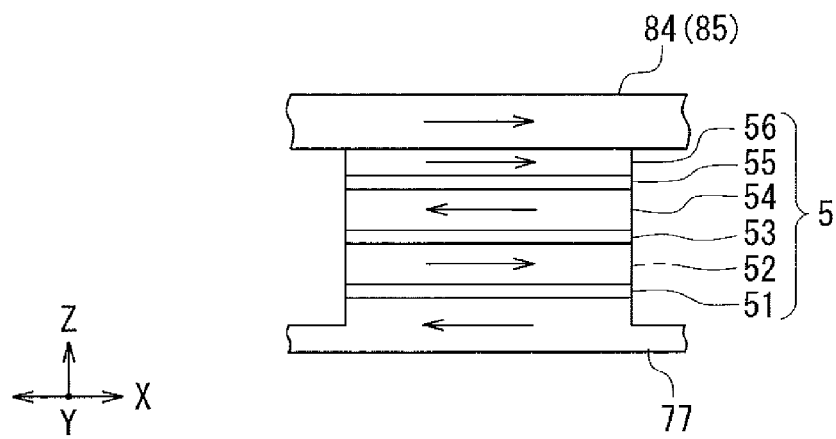
FIG. 5 is an enlarged cross-sectional view of the MR stack and its vicinity shown in FIG. 1.

Now, with reference to FIG. 1 to FIG. 5, the configuration of the MR element according to the present embodiment will be described in detail. FIG. 1 is a cross-sectional view showing a cross section of the MR element parallel to the medium facing surface 40. FIG. 2 is a plan view showing the main part of the MR element. FIG. 3 is a cross-sectional view of the MR element at the position of the line 3-3 shown in FIG. 2. FIG. 4 is a cross-sectional view of the MR element at the position of the line 4-4 shown in FIG. 2. FIG. 5 is an enlarged cross-sectional view of the MR stack and its vicinity shown in FIG. 1. Note that FIG. 3 and FIG. 4 each show a cross section of the MR element perpendicular to the medium facing surface 40 and the top surface of the substrate 1. The X, Y, and Z directions shown in FIG. 11 are also shown in FIG. 1 to FIG. 5. In FIG. 1 and FIG. 5, the Y direction is orthogonal to the X and Z directions. In FIG. 2, the Z direction is orthogonal to the X and Y directions. In FIG. 3 and FIG. 4, the X direction is orthogonal to the Y and Z directions. In FIG. 1 and FIG. 2, the arrow with the symbol TW indicates the track width direction. The track width direction TW is the same as the X direction.

The MR element is intended to detect a magnetic signal written on a track of the recording medium. The MR element includes the first main shield portion 3, the second main shield portion 8, and the MR stack 5 disposed between the first and second main shield portions 3 and 8. The first main shield portion 3, the MR stack 5, and the second main shield portion 8 are arranged in the direction in which the track extends (Z direction). The planar shape (the shape viewed from above) of the MR stack 5 is smaller than that of each of the main shield portions 3 and 8.

The first main shield portion 3 includes a first main shield layer 71, an underlayer 72 disposed on the first main shield layer 71, a first antiferromagnetic layer 73 disposed on the underlayer 72 between the first main shield layer 71 and the MR stack 5, and a first exchange coupling shield layer 74 disposed between the first antiferromagnetic layer 73 and the MR stack 5 and exchange-coupled to the first antiferromagnetic layer 73.

The second main shield portion 8 includes a second main shield layer 81, a second antiferromagnetic layer 83 disposed between the second main shield layer 81 and the MR stack 5, a second exchange coupling shield layer 84 disposed between the second antiferromagnetic layer 83 and the MR stack 5 and exchange-coupled to the second antiferromagnetic layer 83, and a nonmagnetic cap layer 82 disposed between the second antiferromagnetic layer 83 and the second main shield layer 81.

The first exchange coupling shield layer 74 is exchange-coupled to the first antiferromagnetic layer 73. The second exchange coupling shield layer 84 is exchange-coupled to the second antiferromagnetic layer 83. In the present embodiment, one of the first exchange coupling shield layer 74 and the second exchange coupling shield layer 84 includes a shield middle layer that is made of a nonmagnetic conductive material, and two ferromagnetic layers that are antiferromagnetically exchange-coupled to each other via the shield middle layer. The other of the first exchange coupling shield layer 74 and the second exchange coupling shield layer 84 includes one or more ferromagnetic layers, but does not include any shield middle layer. FIG. 1, FIG. 3, and FIG. 4 show an example where the first exchange coupling shield layer 74 includes the shield middle layer and two ferromagnetic layers, the two ferromagnetic layers being antiferromagnetically exchange-coupled to each other via the shield middle layer, while the second exchange coupling shield layer 84 includes one or more ferromagnetic layers and no shield middle layer.

In the example, the first exchange coupling shield layer 74 includes the shield middle layer 76 made of a nonmagnetic conductive material, and the two ferromagnetic layers 75 and 77 which are antiferromagnetically exchange-coupled to each other via the shield middle layer 76. The ferromagnetic layer 75 is disposed between the first antiferromagnetic layer 73 and the shield middle layer 76, and is exchange-coupled to the first antiferromagnetic layer 73. The ferromagnetic layer 77 is disposed between the shield middle layer 76 and the MR stack 5, and is antiferromagnetically exchange-coupled to the ferromagnetic layer 75 via the shield middle layer 76 by the RKKY interaction. The shield middle layer 76 contains, for example, at least one element selected from the group consisting of Ru, Rh, Ir, Cr, Cu, Ag, Au, Pt, and Pd. In the example, the second exchange coupling shield layer 84 includes only a ferromagnetic layer 85 and no shield middle layer. The ferromagnetic layer 85 is exchange-coupled to the second antiferromagnetic layer 83. Alternatively, contrary to this example, the second exchange coupling shield layer 84 may include a shield middle layer, and two ferromagnetic layers that are antiferromagnetically exchanged-coupled to each other via the shield middle layer. In such a configuration, the first exchange coupling shield layer 74 includes one or more ferromagnetic layers and no shield middle layer.

The main shield layers 71 and 81 and the ferromagnetic layers 75, 77, and 85 are each made of a soft magnetic material such as NiFe, CoFe, CoFeB, CoFeNi, or FeN. The main shield layers 71 and 81 and the ferromagnetic layers 75, 77, and 85 each have the shield function of absorbing an excessive magnetic flux.

The underlayer 72 and the nonmagnetic cap layer 82 are each made of a nonmagnetic conductive material. The underlayer 72 contains at least one of Ta and Ru, for example. The nonmagnetic cap layer 82 is made of NiCr, for example.

The antiferromagnetic layers 73 and 83 are each made of an antiferromagnetic material. The antiferromagnetic material to be used for the antiferromagnetic layers 73 and 83 may be a non-heat-induced antiferromagnetic material or a heat-induced antiferromagnetic material. Examples of the non-heat-induced antiferromagnetic material include a Mn alloy that has a γ phase, such as FeMn or IrMn. Examples of the heat-induced antiferromagnetic material include a Mn alloy that has a regular crystal structure, such as PtMn or NiMn.

The ferromagnetic layer 75 of the first exchange coupling shield layer 74 is exchange-coupled to the first antiferromagnetic layer 73, whereby the ferromagnetic layer 75 is made into a single magnetic domain such that the ferromagnetic layer 75 is magnetized in a certain direction. Similarly, the ferromagnetic layer 85 of the second exchange coupling shield layer 84 is exchange-coupled to the second antiferromagnetic layer 83, whereby the ferromagnetic layer 85 is made into a single magnetic domain such that the ferromagnetic layer 85 is magnetized in a certain direction. The directions of magnetization of the ferromagnetic layers 75 and 85 are set by annealing in a magnetic field, and are determined by the direction of the magnetic field at that time. The ferromagnetic layers 75 and 85 thus have the same direction of magnetization. Specifically, the ferromagnetic layers 75 and 85 have the same direction of magnetization parallel to the track width direction TW.

In the first exchange coupling shield layer 74, the ferromagnetic layer 77 is antiferromagnetically exchange-coupled to the ferromagnetic layer 75 via the shield middle layer 76. This makes the directions of magnetization of the ferromagnetic layers 75 and 77 antiparallel to each other, whereby the ferromagnetic layer 77 is made into a single magnetic domain such that the ferromagnetic layer 77 is magnetized in a certain direction. Consequently, the directions of magnetization of the ferromagnetic layers 85 and 77 are antiparallel to each other.

The MR element further includes a pair of insulating layers 4A, the pair of nonmagnetic layers 90, and the pair of side shields 91 located on opposite sides of the MR stack 5 in the track width direction TW. The pair of insulating layers 4A include a pair of first portions and a pair of second portions. The pair of first portions are arranged to cover part of the top surface of the first exchange coupling shield layer 74 at opposite sides of the MR stack 5 in the track width direction TW. The pair of second portions are arranged to cover the two side surfaces of the MR stack 5. The pair of nonmagnetic layers 90 are disposed on the pair of insulating layers 4A. The pair of side shields 91 are disposed on the pair of nonmagnetic layers 90. The pair of nonmagnetic layers 90 and the pair of side shields 91 are both located on opposite sides of the MR stack 5 in the track width direction TW, between the first main shield portion 3 and the second main shield portion 8. The pair of nonmagnetic layers 90 and the pair of side shields 91 adjoin the two side surfaces of the MR stack 5 via the second portions of the insulating layers 4A. The pair of nonmagnetic layers 90 are interposed between the pair of insulating layers 4A and the pair of side shields 91. The insulating layers 4A are made of an insulating material such as alumina. The nonmagnetic layers 90 are made of a nonmagnetic metal material. The nonmagnetic layers 90 may be made of a material selected from the group consisting of Cr, CrTi, and Ru.

Each of the pair of side shields 91 includes a shield-coupling magnetic layer 92 that is in contact with and magnetically coupled to the second exchange coupling shield layer 84 (ferromagnetic layer 85). In the present embodiment, in particular, each of the side shields 91 is composed only of the shield-coupling magnetic layer 92. The ferromagnetic layer 85 and the shield-coupling magnetic layers 92 have the same direction of magnetization parallel to the track width direction TW. The top surfaces of the shield-coupling magnetic layers 92 and the MR stack 5 are flattened. The shield-coupling magnetic layers 92 are made of a soft magnetic material such as NiFe, CoFe, CoFeB, CoFeNi, or FeN. The shield-coupling magnetic layers 92 have the shield function of absorbing an excessive magnetic flux.

The MR element further includes an insulating layer 4B, the bias magnetic field applying layer 6, a protection layer 61, and the insulating refill layer 7 that are disposed between the first main shield portion 3 (first exchange coupling shield layer 74) and the second main shield portion 8 (second exchange coupling shield layer 84). The insulating layer 4B covers the rear end faces of the MR stack 5, the nonmagnetic layers 90 and the side shields 91, and also covers part of the top surface of the first exchange coupling shield layer 74. The insulating layer 4B is made of an insulating material such as alumina.

The bias magnetic field applying layer 6 is disposed to adjoin the rear end faces of the MR stack 5, the nonmagnetic layers 90 and the side shields 91 via the insulating layer 4B. The bias magnetic field applying layer 6 is made mainly of a hard magnetic material (permanent magnet material) such as CoPt or CoCrPt. The bias magnetic field applying layer 6 may be composed of Cr as an underlayer and CoPt formed on the underlayer, for example. The protection layer 61 is disposed between the bias magnetic field applying layer 6 and the second exchange coupling shield layer 84. The protection layer 61 is made of a nonmagnetic conductive material such as Cr.

The insulating refill layer 7 is disposed around the nonmagnetic layers 90, the side shields 91, and the bias magnetic field applying layer 6. The insulating refill layer 7 is made of an insulating material such as alumina.

As shown in FIG. 5, the MR stack 5 includes a spacer layer 53 made of a nonmagnetic material, a first free layer 52 disposed between the first exchange coupling shield layer 74 (ferromagnetic layer 77) and the spacer layer 53, a second free layer 54 disposed between the second exchange coupling shield layer 84 (ferromagnetic layer 85) and the spacer layer 53, and a magnetic cap layer 56 made of a magnetic material and disposed between the second free layer 54 and the second exchange coupling shield layer 84 (ferromagnetic layer 85). The free layers 52 and 54 and the magnetic cap layer 56 are all ferromagnetic layers. The MR stack 5 further includes a nonmagnetic conductive layer 51 disposed between the first exchange coupling shield layer 74 (ferromagnetic layer 77) and the first free layer 52, and a nonmagnetic conductive layer 55 disposed between the second free layer 54 and the magnetic cap layer 56.

The free layers 52 and 54 are each made of a ferromagnetic material having a low coercivity, such as NiFe, CoFe, CoFeB, CoFeNi, or FeN.

If the MR stack 5 is a TMR element, the spacer layer 53 is a tunnel barrier layer. In such a case, the spacer layer 53 is made of an insulating material such as alumina, $SiO_2$, or MgO. If the MR stack 5 is a GMR element of the CPP structure, the spacer layer 53 is a nonmagnetic conductive layer. In such a case, the spacer layer 53 is made of, for example, a nonmagnetic conductive material such as Ru, Rh, Ir, Re, Cr, Zr or Cu, or an oxide semiconductor material such as ZnO, $In_2O_3$ or $SnO_2$.

The nonmagnetic conductive layer 51 is in contact with the bottom surface of the first free layer 52 and the top surface of the ferromagnetic layer 77. The nonmagnetic conductive layer 55 is in contact with the top surface of the second free layer 54 and the bottom surface of the magnetic cap layer 56. The nonmagnetic conductive layers 51 and 55 are each made of a nonmagnetic conductive material containing at least one of Ru, Rh, Ir, Cr, Cu, Ag, Au, Pt, and Pd, for example.

The magnetic cap layer 56 is in contact with the top surface of the nonmagnetic conductive layer 55 and the bottom surface of the ferromagnetic layer 85. The magnetic cap layer 56 is made of a soft magnetic material such as NiFe, CoFe, CoFeB, CoFeNi, or FeN. The magnetic cap layer 56 and the ferromagnetic layer 85 may be made of the same material.

The ferromagnetic layer 77 of the first exchange coupling shield layer 74 and the first free layer 52 are antiferromagnetically exchange-coupled to each other via the nonmagnetic conductive layer 51 by the RKKY interaction. The directions of magnetization of the first free layer 52 and the ferromagnetic layer 77 are therefore antiparallel to each other. In this way, the first free layer 52 is magnetically coupled to the first exchange coupling shield layer 74, whereby the direction of magnetization of the first free layer 52 is controlled.

The magnetic cap layer 56 is in contact with and magnetically coupled to the ferromagnetic layer 85 of the second exchange coupling shield layer 84. The ferromagnetic layer 85 and the magnetic cap layer 56 have the same direction of magnetization. The magnetic cap layer 56 and the second free layer 54 are antiferromagnetically exchange-coupled to each other via the nonmagnetic conductive layer 55 by the RKKY interaction. The directions of magnetization of the magnetic cap layer 56 and the second free layer 54 are therefore antiparallel to each other. Consequently, the directions of magnetization of the second free layer 54 and the ferromagnetic layer 85 are antiparallel to each other. In this way, the second free layer 54 is magnetically coupled to the second exchange coupling shield layer 84 via the magnetic cap layer 56, whereby the direction of magnetization of the second free layer 54 is controlled.

In the present embodiment, the directions of magnetization of the ferromagnetic layers 77 and 85 are antiparallel to each other. Suppose a state where the first and second free layers 52 and 54 are subjected to no external magnetic field other than the magnetic fields that result from the first and second exchange coupling shield layers 74 and 84. When in such a state, the directions of magnetization of the first free layer 52 and the ferromagnetic layer 77 are antiparallel to each other, and the directions of magnetization of the second free layer 54 and the ferromagnetic layer 85 are also antiparallel to each other. Consequently, when in such a state, the directions of magnetization of the first free layer 52 and the second free layer 54 are antiparallel to each other.

When no magnetic field is applied to the MR element from the outside of the MR element, all of magnetic fields to be applied to the free layers 52 and 54, except the bias magnetic field produced by the bias magnetic field applying layer 6, result from the first and second exchange coupling shield layers 74 and 84. Therefore, the state where the free layers 52 and 54 are subjected to no external magnetic field other than the magnetic fields that result from the first and second exchange coupling shield layers 74 and 84 refers to the state where the free layers 52 and 54 are not subjected to the bias magnetic field produced by the bias magnetic field applying layer 6 when no magnetic field is applied to the MR element from the outside of the MR element.

Possible configurations of the MR stack 5 of the present embodiment are not limited to the configuration shown in FIG. 5. For example, the nonmagnetic conductive layers 51 and 55 in the MR stack 5 may be replaced with first and second coupling layers each of which includes a plurality of nonmagnetic conductive layers and magnetic layers interposed between adjacent ones of the nonmagnetic conductive layers. Here, the first coupling layer and the second coupling layer shall include the same number of layers. This makes it possible to make the directions of magnetization of the first free layer 52 and the second free layer 54 antiparallel to each other.

As shown in FIG. 1, FIG. 3 and FIG. 4, the first exchange coupling shield layer 74 has a top surface 74a and a bottom surface 74b. The bottom surface 74b is in contact with the first antiferromagnetic layer 73. The top surface 74a includes a first portion 74a1, a second portion 74a2, a third portion 74a3, and a fourth portion 74a4. The first portion 74a1 is in contact with the MR stack 5. The second portion 74a2 and the third portion 74a3 are located closer to the bottom surface 74b than is the first portion 74a1 so that recesses 79a and 79b are formed below the pair of nonmagnetic layers 90. The fourth portion 74a4 is located closer to the bottom surface 74b than is the first portion 74a1 so that a recess 79c is formed below the bias magnetic field applying layer 6. The pair of insulating layers 4A are disposed on the second portion 74a2 and the third portion 74a3. The pair of nonmagnetic layers 90 are disposed on the pair of insulating layers 4A. The insulating layer 4B is disposed on the fourth portion 74a4. The bias magnetic field applying layer 6 is disposed on the insulating layer 4B.

The bias magnetic field applying layer 6 applies a bias magnetic field to the free layers 52 and 54 so that the directions of magnetization of the free layers 52 and 54 are changed from those in the state where no bias magnetic field is applied to the free layers 52 and 54. The bias magnetic field applying layer 6 preferably applies a bias magnetic field to the free layers 52 and 54 so that the directions of magnetization of the free layers 52 and 54 become orthogonal to each other.

The MR element according to the present embodiment is of the CPP structure. More specifically, a sense current, which is a current used for detecting a signal magnetic field, is fed in a direction intersecting the planes of the layers constituting the MR stack 5, such as the direction perpendicular to the planes of the layers constituting the MR stack 5. The first main shield portion 3 and the second main shield portion 8 also function as a pair of electrodes for feeding the sense current to the MR stack 5 in a direction intersecting the planes of the layers constituting the MR stack 5, such as the direction perpendicular to the planes of the layers constituting the MR stack 5.

Figure 8:
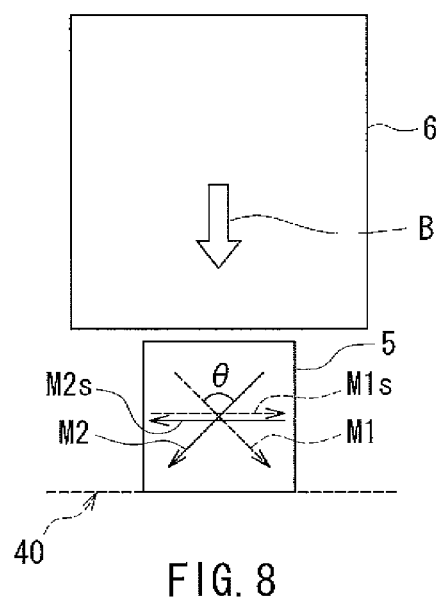
FIG. 8 is an explanatory diagram for explaining the operation of the magnetoresistive element according to the first embodiment of the invention.
Figure 9:
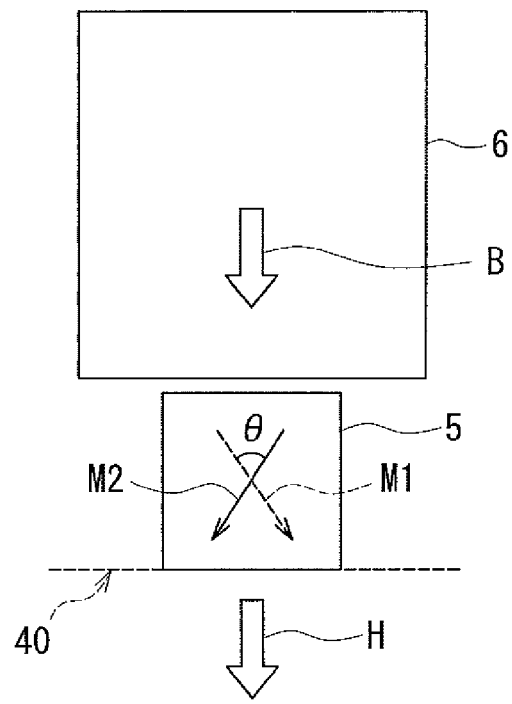
FIG. 9 is an explanatory diagram for explaining the operation of the magnetoresistive element according to the first embodiment of the invention.
Figure 10:
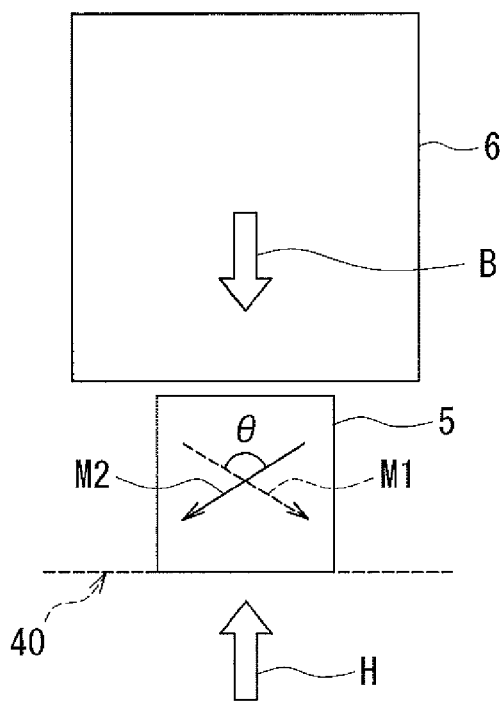
FIG. 10 is an explanatory diagram for explaining the operation of the magnetoresistive element according to the first embodiment of the invention.

The operation of the MR element according to the present embodiment will now be described with reference to FIG. 8 to FIG. 10. FIG. 8 to FIG. 10 each show the MR stack 5 and the bias magnetic field applying layer 6. In FIG. 8 to FIG. 10, the arrow with the symbol "B" indicates the bias magnetic field produced by the bias magnetic field applying layer 6. The arrow with the symbol "M1s" indicates the direction of magnetization of the first free layer 52 when the first free layer 52 is not subjected to any external magnetic field (including bias magnetic field) other than the magnetic fields that result from the first and second exchange coupling shield layers 74 and 84. The arrow with the symbol "M2s" indicates the direction of magnetization of the second free layer 54 when the second free layer 54 is not subjected to any external magnetic field described above. The arrow with the symbol "M1" indicates the direction of magnetization of the first free layer 52 when the first free layer 52 is subjected to the bias magnetic field B. The arrow with the symbol "M2" indicates the direction of magnetization of the second free layer 54 when the second free layer 54 is subjected to the bias magnetic field B.

As shown in FIG. 8, the directions of magnetization of the free layers 52 and 54 are antiparallel to each other when the free layers 52 and 54 are not subjected to any external magnetic field. When the free layers 52 and 54 are subjected to the bias magnetic field B and no signal magnetic field, the directions of magnetization of the free layers 52 and 54 become non-antiparallel to each other. When in such a state, the directions of magnetization of the first free layer 52 and the second free layer 54 each preferably form an angle of 45 degrees with respect to the medium facing surface 40 so that the relative angle θ between the directions of magnetization of the free layers 52 and 54 is 90 degrees.

FIG. 9 shows a state where the free layers 52 and 54 are subjected to the bias magnetic field B and also a signal magnetic field H in the same direction as the bias magnetic field B. When in such a state, the angle that the direction of magnetization of the first free layer 52 forms with respect to the medium facing surface 40 and the angle that the direction of magnetization of the second free layer 54 forms with respect to the medium facing surface 40 are both greater as compared with the state shown in FIG. 8. Consequently, the relative angle θ between the directions of magnetization of the free layers 52 and 54 is smaller as compared with the state shown in FIG. 8.

FIG. 10 shows a state where the free layers 52 and 54 are subjected to the bias magnetic field B and also a signal magnetic field H in the direction opposite to the direction of the bias magnetic field B. When in such a state, the angle that the direction of magnetization of the first free layer 52 forms with respect to the medium facing surface 40 and the angle that the direction of magnetization of the second free layer 54 forms with respect to the medium facing surface 40 are both smaller as compared with the state shown in FIG. 8. Consequently, the relative angle θ between the directions of magnetization of the free layers 52 and 54 is greater as compared with the state shown in FIG. 8.

As seen above, the relative angle between the directions of magnetization of the free layers 52 and 54 changes in response to the signal magnetic field, and the change causes a change in resistance of the MR stack 5. The signal magnetic field can therefore be detected by detecting the resistance of the MR stack 5. The resistance of the MR stack 5 can be determined from the potential difference produced in the MR stack 5 when a sense current is fed to the MR stack 5. With the MR element, it is thus possible to read data stored on the recording medium.

A description will now be given of an example of specific configuration of the MR element of the present embodiment. Hereinafter, the MR element of this specific configuration will be referred to as an MR element of practical example. In the following description, the thickness of each layer will refer to the dimension of the layer in the stacking direction (the direction perpendicular to the top surface of the substrate 1) of a plurality of layers where the plurality of layers are stacked. Table 1 shows the respective configurations of the underlayer 72, the first antiferromagnetic layer 73, the first exchange coupling shield layer 74, and the MR stack 5 in the MR element of practical example.

TABLE 1

| Configuration of practical example | | Material | Thickness (nm) |
|---|---|---|---|
| MR stack 5 | Magnetic cap layer 56 | Magnetic layer NiFe | 5 |
| | | Magnetic layer CoFe | 1 |
| | Nonmagnetic conductive layer 55 | Ru | 0.8 |
| | Second free layer 54 | Magnetic layer NiFe | 3 |
| | | Magnetic layer CoFeB | 1 |
| | | Magnetic layer $Co_{30}Fe_{70}$ | 1 |
| | Spacer layer 53 | MgO | 3 |
| | First free layer 52 | Magnetic layer $Co_{30}Fe_{70}$ | 1 |
| | | Magnetic layer CoFeB | 1 |
| | | Magnetic layer NiFe | 3 |
| | Nonmagnetic conductive layer 51 | Ru | 0.8 |
| First | Ferromagnetic | Magnetic layer $Co_{90}Fe_{10}$ | 1 |

TABLE 1-continued

| Configuration of practical example | | Material | Thickness (nm) |
|---|---|---|---|
| exchange coupling shield layer 74 | layer 77 | Magnetic layer NiFe | 8 |
| | | Magnetic layer $Co_{90}Fe_{10}$ | 1 |
| | Shield middle layer 76 | Ru | 0.8 |
| | Ferromagnetic layer 75 | Magnetic layer $Co_{90}Fe_{10}$ | 1 |
| | | Magnetic layer NiFe | 8 |
| | | Magnetic layer $Co_{90}Fe_{10}$ | 1 |
| First antiferromagnetic layer 73 | | IrMn | 7 |
| Underlayer 72 | | Nonmagnetic conductive layer Ru | 2 |
| | | Nonmagnetic conductive layer Ta | 1 |

In the practical example, each of the first free layer 52 and the second free layer 54 is formed by stacking three magnetic layers, namely, an NiFe layer, a CoFeB layer, and a CoFe layer. The CoFe layer in each of the free layers 52 and 54 is composed of 30 atomic % Co and balance Fe. In the practical example, the spacer layer 53 is made of MgO. The spacer layer 53 is thus a tunnel barrier layer, and therefore the MR stack 5 is a TMR element.

In the practical example, the magnetic cap layer 56 is formed by stacking two magnetic layers, namely, a CoFe layer and an NiFe layer. It should be noted that the thickness of the NiFe layer of the magnetic cap layer 56 shown in Table 1 is the thickness before undergoing cleaning to be described later. Combined with the second exchange coupling shield layer 84, the magnetic cap layer 56 functions as a shield that is disposed on the upper side of the MR stack 5. In the practical example, the read gap length is thus the distance from the bottom surface of the nonmagnetic conductive layer 51 to the top surface of the nonmagnetic conductive layer 55, which is 14.6 nm.

In the practical example, each of the ferromagnetic layers 75 and 77 of the first exchange coupling shield layer 74 is formed by stacking three magnetic layers, namely, a CoFe layer, an NiFe layer, and a CoFe layer. While NiFe is typically used as a shield material, a CoFe layer is provided in the part of the ferromagnetic layer 75 that makes contact with the first antiferromagnetic layer 73. The aim is to increase the exchange coupling magnetic field that acts between the ferromagnetic layer 75 and the first antiferromagnetic layer 73. The CoFe layer in each of the ferromagnetic layers 75 and 77 may be composed of 70 to 90 atomic % Co and balance Fe, for example. In the practical example, the CoFe layer in each of the ferromagnetic layers 75 and 77 is composed of 90 atomic % Co and balance Fe. The underlayer 72 is formed by stacking two nonmagnetic conductive layers, namely, a Ta layer and a Ru layer. Note that in Table 1, a CoFe alloy that contains M atomic % Co and N atomic % Fe is expressed as $Co_MFe_N$.

In the practical example, the pair of insulating layers 4 are formed of alumina, the pair of nonmagnetic layers 90 are each formed of a CrTi layer, and the pair of shield-coupling magnetic layers 92 are each formed of an NiFe layer. In the practical example, the top surfaces of the shield-coupling magnetic layers 92 and the MR stack 5 are flattened. The top surfaces of the shield-coupling magnetic layers 92 are at the same level as the top surface of the magnetic cap layer 56. The insulating layers 4A have a thickness of 5 nm, for example. The thickness of the insulating layers 4A refers to the thickness of the portions of the insulating layers 4A that extend along the top surface of the first exchange coupling shield layer 74 (ferromagnetic layer 77) at opposite sides of the MR stack 5 in the track width direction TW. Before the cleaning to be described later, the total thickness of the shield-coupling magnetic layer 92 and the nonmagnetic layer 90 is 25 nm, for example. The ratio of the thickness of the shield-coupling magnetic layer 92 to the total thickness of the shield-coupling magnetic layer 92 and the nonmagnetic layer 90 preferably falls within the range of 13% to 87%, or more preferably within the range of 22% to 65%. The reason will be described in detail later.

In the practical example, each of the first and second main shield layers 71 and 81 is formed of an NiFe layer. Each of the first and second main shield layers 71 and 81 has a thickness in the range of 0.5 to 2.0 µm, for example. In the practical example, the ferromagnetic layer 85 of the second exchange coupling shield layer 84 is formed by stacking two magnetic layers, namely, an NiFe layer and a CoFe layer. The NiFe layer in the ferromagnetic layer 85 has a thickness of 3 nm, for example. The CoFe layer in the ferromagnetic layer 85 has a thickness of 2 nm, for example. The CoFe layer in the ferromagnetic layer 85 has the same configuration as that of the CoFe layer in each of the ferromagnetic layers 75 and 77. In the practical example, the second antiferromagnetic layer 83 has the same configuration as that of the first antiferromagnetic layer 73.

A method of manufacturing the MR element according to the present embodiment will now be described with reference to FIG. 1, FIG. 3, FIG. 4, and FIG. 15 to FIG. 18. FIG. 15 to FIG. 18 each show a cross section of a stack of layers in the process of manufacturing the MR element, the cross section being perpendicular to the medium facing surface 40 and the top surface of the substrate 1. The portions lying below the main shield layer 71 are omitted in FIG. 15 to FIG. 18.

Figure 15:
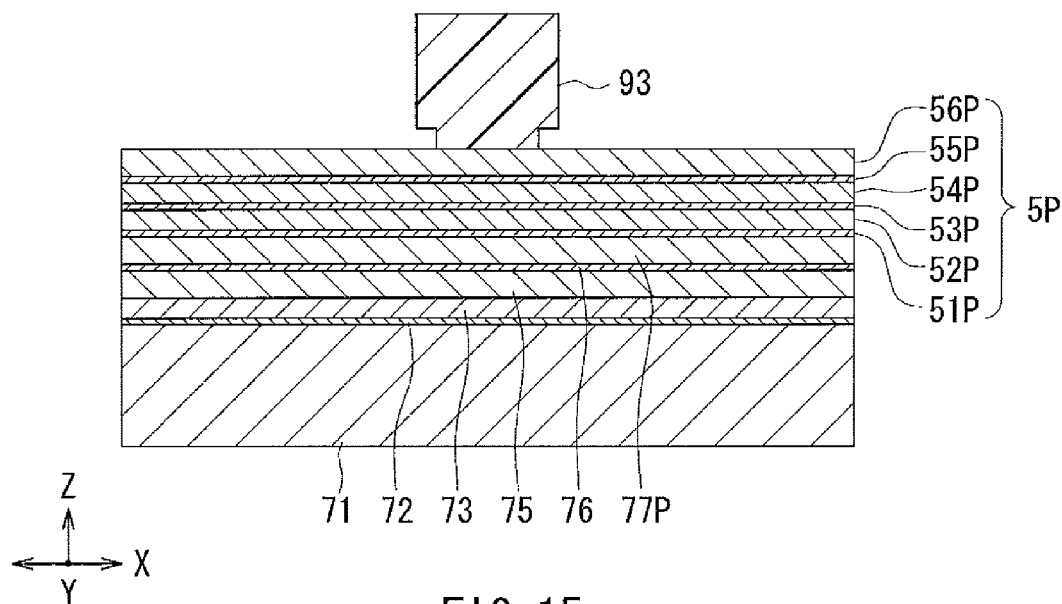
FIG. 15 is a cross-sectional view showing a step of a method of manufacturing the magnetoresistive element according to the first embodiment of the invention.

In the method of manufacturing the MR element according to the present embodiment, as shown in FIG. 15, the first main shield layer 71 is initially formed into a predetermined pattern on the insulating layer 2 by frame plating, for example. Next, the underlayer 72, the first antiferromagnetic layer 73, the ferromagnetic layer 75, the shield middle layer 76, and a magnetic layer 77P are formed in this order on the first main shield layer 71 by sputtering, for example. The magnetic layer 77P is to become the ferromagnetic layer 77 later. Next, a layered film 5P is formed on the magnetic layer 77P. The layered film 5P is to be patterned into the MR stack 5 later. Specifically, the following films are formed in succession on the magnetic layer 77P by, for example, sputtering: a nonmagnetic film 51P to become the nonmagnetic conductive layer 51; a magnetic film 52P to become the first free layer 52; a nonmagnetic film 53P to become the spacer layer 53; a magnetic film 54P to become the second free layer 54; a nonmagnetic film 55P to become the nonmagnetic conductive layer 55; and a magnetic film 56P to become the magnetic cap layer 56. Next, a mask 93 to be used for patterning the layered film 5P is formed on the magnetic film 56P. The mask 93 preferably has an undercut shape as shown in FIG. 15 for the sake of easy removal later. For example, the undercut mask 93 may be composed of a lower layer and an upper layer. The upper layer is made of a photoresist that is patterned by photolithography. The lower layer is made of, for example, a material that dissolves in a developing solution to be used when patterning the upper layer.

Figure 16:
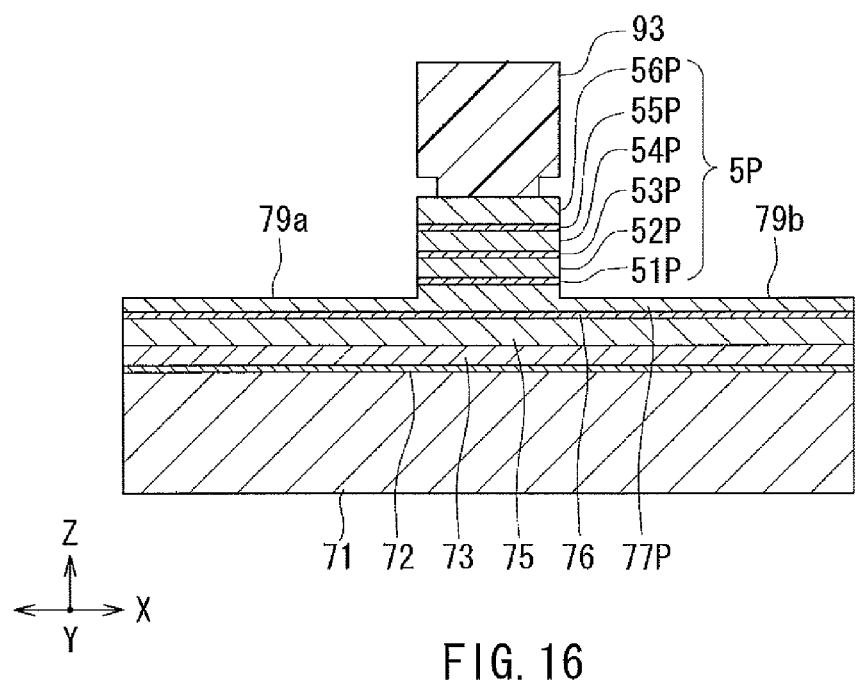
FIG. 16 is a cross-sectional view showing a step that follows the step of FIG. 15.

FIG. 16 shows the next step. In this step, the layered film 5P is etched into a predetermined shape by, for example, ion milling, using the mask 93 as the etching mask. The layered film 5P is thereby patterned so that its dimension in the track width direction is equal to that of the MR stack 5. In this step, the magnetic layer 77P is also etched partially in the areas where the pair of nonmagnetic layers 90 and the pair of side shields 91 are to be disposed later. This forms the recesses 79a and 79*b* in the magnetic layer 77P. The depth of the groove formed in the layered film 5P and the magnetic layer 77P by the etching in this step (hereinafter, referred to as the etching depth) is 30 nm, for example.

Figure 17:
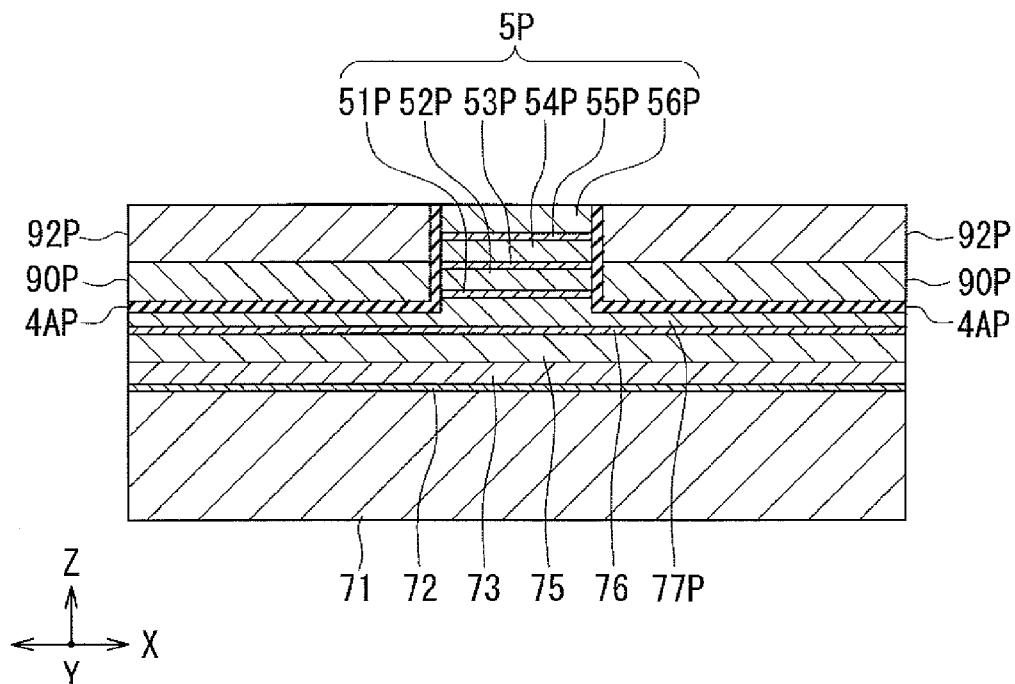
FIG. 17 is a cross-sectional view showing a step that follows the step of FIG. 16.

FIG. 17 shows the next step. In this step, an insulating film 4AP, a nonmagnetic film 90P, and a magnetic film 92P are initially formed in succession over the entire top surface of the stack shown in FIG. 16 by, for example, sputtering, with the mask 93 left intact. The insulating film 4AP is to become the pair of insulating layers 4A later. The nonmagnetic film 90P is to become the pair of nonmagnetic layers 90 later. The magnetic film 92P is to become the pair of shield-coupling magnetic layers 92 later. Next, the mask 93 is removed.

The magnetic film 92P is formed so that the top surface of the magnetic film 92P is at the same level as the top surface of the magnetic film 56P of the layered film 5P. The top surfaces of the magnetic film 92P and the layered film 5P are thereby made flat. The total thickness of the insulating film 4AP, the nonmagnetic film 90P and the magnetic film 92P is equal to the etching depth of the layered film 5P and the magnetic layer 77P.

Next, although not shown in the drawings, the insulating layer 4B, the insulating refill layer 7, the bias magnetic field applying layer 6, and the protection layer 61 are formed in the following manner. First, a not-shown second mask is formed on the stack after the removal of the mask 93. The second mask covers at least a part of the layered film 5P and a part of the magnetic film 92P. Next, the layered film 5P, the insulating film 4AP, the nonmagnetic film 90, and the magnetic film 92P are etched by, for example, ion milling, using the second mask as the etching mask. Next, the insulating refill layer 7 is formed over the entire top surface of the stack by, for example, sputtering, with the second mask left intact. The second mask is then removed.

Next, a not-shown third mask is formed on the stack after the removal of the second mask. The third mask has an opening that has a shape corresponding to the planar shape of the bias magnetic field applying layer 6 to be formed later. Next, the layered film 5P, the insulating film 4AP, the nonmagnetic film 90P, the magnetic film 92P, and the insulating refill layer 7 are etched by, for example, ion milling, using the third mask as the etching mask. As a result, the remaining layered film 5P makes the MR stack 5, the remaining insulating film 4AP makes the pair of insulating layers 4A, the remaining nonmagnetic film 90P makes the pair of nonmagnetic layers 90, and the remaining magnetic film 92P makes the pair of shield-coupling magnetic layers 92. The foregoing etching also forms the respective rear end faces of the MR stack 5, the nonmagnetic layers 90 and the shield-coupling magnetic layers 92. In this step, the magnetic layer 77P is also etched partially in the area where the bias magnetic field applying layer 6 is to be disposed later. This forms the recess 79*c* in the magnetic layer 77P. The remaining magnetic layer 77P makes the ferromagnetic layer 77. Next, the insulating layer 4B, the bias magnetic field applying layer 6, and the protection layer 61 are formed in succession by, for example, sputtering, with the third mask left intact. As shown in FIG. 3 and FIG. 4, the bias magnetic field applying layer 6 is disposed over the recess 79*c* so as to adjoin the rear end faces of the MR stack 5, the nonmagnetic layers 90 and the shield-coupling magnetic layers 92 and the surface of the ferromagnetic layer 77 via the insulating layer 4B. The bias magnetic field applying layer 6 may be composed of a Cr layer formed on the insulating layer 4B and a CoPt layer formed on the Cr layer. Next, the third mask is removed.

As mentioned above, the top surfaces of the magnetic film 92P and the layered film 5P are flattened. Consequently, when forming the second and third masks, the top surface of the stack is flat in the vicinity of the layered film 5P. According to the present embodiment, it is therefore possible to form the second and third masks with high precision, particularly in the vicinity of the layered film 5P. After the removal of the third mask, the shield-coupling magnetic layers 92 and the MR stack 5 are also flat at the top.

Instead of an inorganic insulating material such as alumina, the nonmagnetic film 90P (nonmagnetic layers 90) may be formed of a nonmagnetic metal material such as Cr, CrTi, or Ru. Such a material can increase the etching rate of the nonmagnetic film 90P when etching the layered film 5P, the insulating film 4AP, the nonmagnetic film 90P, and the magnetic film 92P by ion milling to form the respective rear end faces of the MR stack 5, the nonmagnetic layers 90 and the shield-coupling magnetic layers 92.

Figure 18:
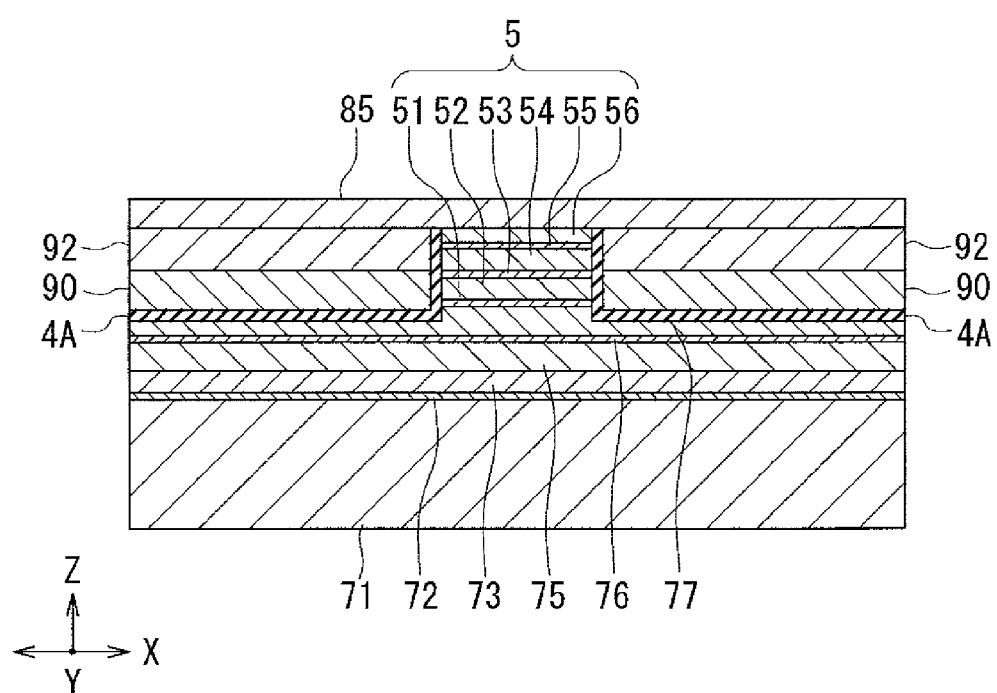
FIG. 18 is a cross-sectional view showing a step that follows the step of FIG. 17.

FIG. 18 shows the next step. In this step, the top surfaces of the shield-coupling magnetic layers 92 and the magnetic cap layer 56 are initially cleaned by etching. Specifically, the top surfaces of the shield-coupling magnetic layers 92 and the magnetic cap layer 56 are etched by reverse sputtering or ion milling, for example. The amount of etching of the shield-coupling magnetic layers 92 and the magnetic cap layer 56 is around 2 nm, for example. As mentioned above, the shield-coupling magnetic layers 92 and the magnetic cap layer 56 are flat at the top after the removal of the third mask. Consequently, the shield-coupling magnetic layers 92 and the MR stack 5 are also flat at the top after the cleaning of the top surfaces of the shield-coupling magnetic layers 92 and the magnetic cap layer 56. Next, the ferromagnetic layer 85 is formed over the MR stack 5, the protection layer 61 and the shield-coupling magnetic layers 92 by, for example, sputtering, so as to be in contact with the top surfaces of the shield-coupling magnetic layers 92 and the magnetic cap layer 56.

Next, as shown in FIG. 1, FIG. 3 and FIG. 4, the second antiferromagnetic layer 83 and the nonmagnetic cap layer 82 are formed in this order on the ferromagnetic layer 85 by sputtering, for example. Next, the second main shield layer 81 is formed into a predetermined pattern by frame plating, for example.

The direction of magnetization of the ferromagnetic layers 75 and 85 and the direction of magnetization of the bias magnetic field applying layer 6 are set by separate steps of magnetization processing including annealing at respective different temperatures. The direction of magnetization of the ferromagnetic layers 75 and 85 and the direction of magnetization of the bias magnetic field applying layer 6 can be set to opposite directions because the appropriate annealing temperatures for the magnetization processing on those layers are different from each other. For example, in the magnetization processing for setting the direction of magnetization of the ferromagnetic layers 75 and 85, the annealing is performed at a temperature of 250° C. for three hours with a magnetic field intensity of 10 kOe (1 Oe=79.6 A/m).

The effects of the MR element according to the present embodiment will now be described. In the present embodiment, the ferromagnetic layer 75 of the first exchange coupling shield layer 74 is exchange-coupled to the first antiferromagnetic layer 73. The ferromagnetic layer 77 is antiferromagnetically exchange-coupled to the ferromagnetic layer 75 via the shield middle layer 76. The direction of magnetization of the ferromagnetic layer 77 is thereby determined. Meanwhile, the ferromagnetic layer 85 of the second exchange coupling shield layer 84 is exchange-coupled to the second antiferromagnetic layer 83, whereby the direction of magnetization of the ferromagnetic layer 85 is determined. Consequently, the directions of magnetization of the ferromagnetic layers 85 and 77 are antiparallel to each other. The first free layer 52 is magnetically coupled to the ferromagnetic layer 77, and the second free layer 54 is magnetically coupled to the ferromagnetic layer 85. Specifically, the first free layer 52 is antiferromagnetically exchange-coupled to the ferromagnetic layer 77 via the nonmagnetic conductive layer 51. The second free layer 54 is antiferromagnetically exchange-coupled to the magnetic cap layer 56 via the nonmagnetic conductive layer 55, and is magnetically coupled to the second exchange coupling shield layer 84 via the magnetic cap layer 56. As a result, the directions of magnetization of the two free layers 52 and 54 are antiparallel to each other when the two free layers 52 and 54 are subjected to no external magnetic field other than the magnetic fields that result from the first and second exchange coupling shield layers 74 and 84. According to the present embodiment, it is thus possible to maintain the directions of magnetization of the two free layers 52 and 54 antiparallel to each other when in the state where no external magnetic field is applied, without making use of antiferromagnetic coupling between the two free layers via the spacer layer 53. Consequently, according to the present embodiment, no limitation is imposed on the material and thickness of the spacer layer 53, in contrast to the case of making use of antiferromagnetic coupling between the two free layers.

Moreover, the present embodiment allows a reduction in read gap length because no antiferromagnetic layer is present between the MR stack 5 and each of the ferromagnetic layers 77 and 85 which each function as a shield. In the practical example shown in Table 1, the read gap length is 14.6 nm. This is much smaller than the read gap length of a typical spin-valve MR element, which is 30 nm or so.

In the present embodiment, the first main shield portion 3, the MR stack 5, and the second main shield portion 8 are arranged in the direction in which the tracks extend. The pair of side shields 91 are disposed on opposite sides of the MR stack 5 in the track width direction TW, between the first main shield portion 3 and the second main shield portion 8. Each of the pair of side shields 91 includes the shield-coupling magnetic layer 92. The shield-coupling magnetic layers 92 have the shield function of absorbing an excessive magnetic flux. Consequently, according to the present embodiment, the pair of side shields 91 are capable of absorbing an excessive magnetic flux in the track width direction TW of the MR stack 5. According to the present embodiment, it is thus possible to make the effective track width of the MR stack 5 smaller.

In the present embodiment, each of the pair of side shields 91 has the shield-coupling magnetic layer 92 which is in contact with and magnetically coupled to the second exchange coupling shield layer 84 (ferromagnetic layer 85). The magnetic flux absorbed by the shield-coupling magnetic layers 92 flows to the ferromagnetic layer 85 of high volume. The shield-coupling magnetic layers 92 are thus capable of absorbing a larger amount of magnetic flux as compared with the case where the shield-coupling magnetic layers 92 were magnetically isolated from the exchange coupling shield layers 74 and 84. Consequently, according to the present embodiment, a larger amount of magnetic flux can be absorbed by the pair of side shields 91 (shield-coupling magnetic layers 92) as compared with the case where the pair of side shields were magnetically isolated from the exchange coupling shield layers 74 and 84. This improves the function of the side shields 91 to absorb an excessive magnetic flux. According to the present embodiment, it is therefore possible to make the effective track width of the MR stack 5 even smaller.

According to the present embodiment, as shown in FIG. 1, the shield-coupling magnetic layers 92 are exchange-coupled to the ferromagnetic layer 85, whereby the direction of magnetization of the shield-coupling magnetic layers 92 is controlled. As a result, the shield-coupling magnetic layers 92 have the same direction of magnetization as that of the ferromagnetic layer 85. Consequently, according to the present embodiment, the direction of magnetization of the side shields 91 (shield-coupling magnetic layers 92) is stabilized. According to the present embodiment, it is thereby possible to prevent the MR element from becoming unstable in operation due to changes in the direction of magnetization of the side shields 91 (shield-coupling magnetic layers 92).

If the top surfaces of the shield-coupling magnetic layers 92 and the MR stack 5 are not flattened, the second exchange coupling shield layer 84 and the second antiferromagnetic layer 83 can vary in thickness from one MR element to another, particularly in the vicinity of the top surface of the MR stack 5. If the thicknesses of the second exchange coupling shield layer 84 and the second antiferromagnetic layer 83 vary between a plurality of MR elements, the exchange coupling magnetic field that magnetically couples the second free layer 54 to the second exchange coupling shield layer 84 also varies. This results in characteristic variations between the plurality of MR elements.

In the present embodiment, the top surfaces of the shield-coupling magnetic layers 92 and the MR stack 5 are flattened. Consequently, according to the present embodiment, it is possible to prevent the thicknesses of the second exchange coupling shield layer 84 and the second antiferromagnetic layer 83 from varying from one MR element to another. It is thereby possible to reduce characteristic variations between a plurality of MR elements.

If the shield-coupling magnetic layers 92 are too thick, the shield-coupling magnetic layers 92 can absorb some of the signal magnetic field and cause a drop in the read output of the MR element. It is therefore desirable to make the thickness of the shield-coupling magnetic layers 92 fall within a predetermined range. In the present embodiment, the nonmagnetic layers 90 are provided between the insulating layers 4A and the shield-coupling magnetic layers 92 so that the thickness of the shield-coupling magnetic layers 92 can fall within the predetermined range and the top surfaces of the shield-coupling magnetic layers 92 and the MR stack 5 can be made flat. In other words, the thicknesses of the nonmagnetic layers 90 and the shield-coupling magnetic layers 92 can be adjusted so that the thickness of the shield-coupling magnetic layers 92 falls within the predetermined range and the top surfaces of the shield-coupling magnetic layers 92 and the MR stack 5 are made flat.

In the present embodiment, the nonmagnetic layers 90 are formed of a nonmagnetic metal material such as Cr, CrTi, or Ru, instead of an inorganic insulating material such as alumina. As mentioned previously, this makes it possible to increase the etching rate of the nonmagnetic film 90P when etching the layered film 5P, the insulating film 4AP, the nonmagnetic film 90P and the magnetic film 92P by ion milling to form the respective rear end faces of the MR stack 5, the nonmagnetic layers 90 and the shield-coupling magnetic layers 92.

The effects of the MR element according to the present embodiment will be described further with reference to experimental results after the description of a second embodiment.

Second Embodiment

Figure 19:
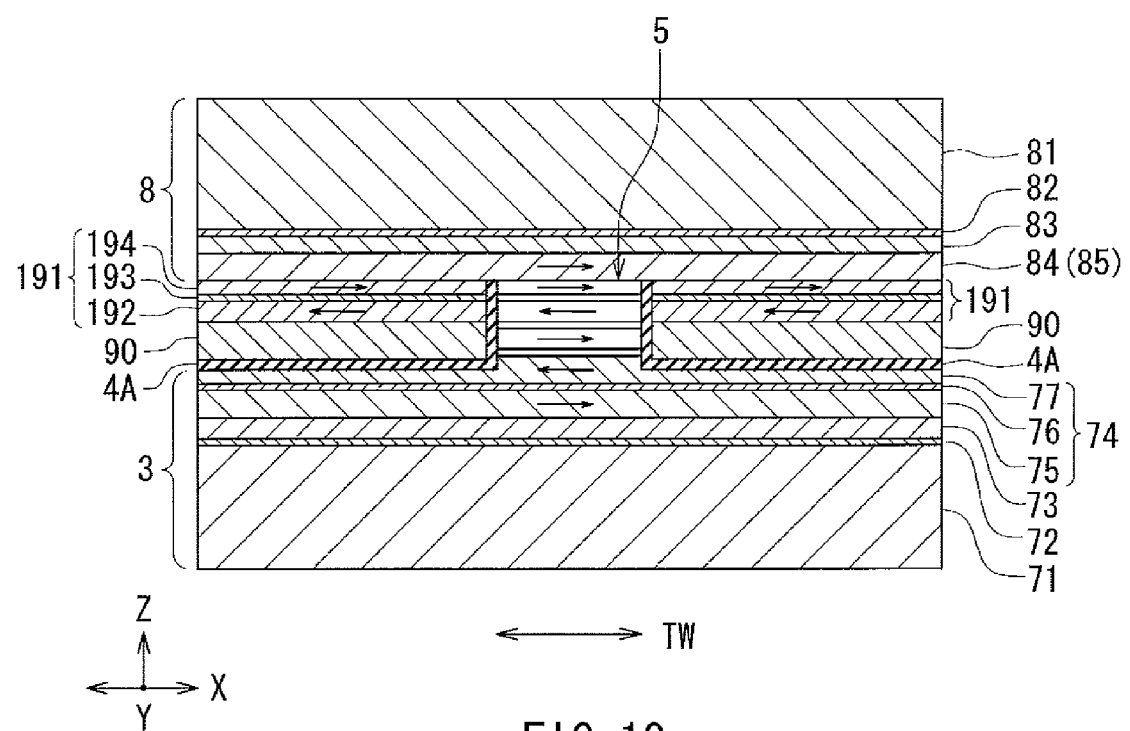
FIG. 19 is a cross-sectional view showing a cross section of a magnetoresistive element according to a second embodiment of the invention parallel to the medium facing surface.

A second embodiment of the invention will now be described with reference to FIG. 19. FIG. 19 is a cross-sectional view showing a cross section of the MR element according to the present embodiment parallel to the medium facing surface. The MR element according to the present embodiment has a pair of side shields 191 instead of the pair of side shields 91 of the first embodiment. The pair of side shields 191 are disposed on opposite sides of the MR stack 5 in the track width direction TW, between the first main shield portion 3 and the second main shield portion 8.

Each of the pair of side shields 191 includes a side shield middle layer 193 made of a nonmagnetic conductive material, and first and second side shield magnetic layers 192 and 194 that are antiferromagnetically exchange-coupled to each other via the side shield middle layer 193. The first side shield magnetic layer 192, the side shield middle layer 193, and the second side shield magnetic layer 194 are stacked in this order on the nonmagnetic layer 90. The top surfaces of the second side shield magnetic layers 194 and the MR stack 5 are flattened. The second side shield magnetic layers 194 are in contact with and magnetically coupled to the second exchange coupling shield layer 84 (ferromagnetic layer 85). The second side shield magnetic layers 194 thus correspond to the shield-coupling magnetic layer of the present invention. The first side shield magnetic layers 192 are preferably located at almost the same level as the second free layer 54.

The side shield middle layers 193 contain at least one element selected from the group consisting of Ru, Rh, Ir, Cr, Cu, Ag, Au, Pt, and Pd, for example. The first and second side shield magnetic layers 192 and 194 are made of a soft magnetic material such as NiFe, CoFe, CoFeB, CoFeNi, or FeN. The first and second side shield magnetic layers 192 and 194 each have the shield function of absorbing an excessive magnetic flux.

The ferromagnetic layer 85 and the second side shield magnetic layers 194 have the same direction of magnetization. The second side shield magnetic layers 194 are antiferromagnetically exchange-coupled to the first side shield magnetic layers 192 via the side shield middle layers 193 by the RKKY interaction. The direction of magnetization of the second side shield magnetic layers 194 and the direction of magnetization of the first side shield magnetic layers 192 are therefore antiparallel to each other. Consequently, the direction of magnetization of the first side shield magnetic layers 192 and the direction of magnetization of the ferromagnetic layer 85 are antiparallel to each other.

A method of manufacturing the MR element according to the present embodiment will now be described. The method of manufacturing the MR element according to the present embodiment is the same as the method according to the first embodiment up to the step of forming the insulating film 4AP as shown in FIG. 17. In the present embodiment, after the formation of the insulating film 4AP, a nonmagnetic film 90P, a first magnetic film, a second nonmagnetic film, and a second magnetic film are formed in succession over the entire top surface of the stack by, for example, sputtering, with the mask 93 left intact. The nonmagnetic film 90P is to become the pair of nonmagnetic layers 90 later. The first magnetic film is to become the pair of first side shield magnetic layers 192 later. The second nonmagnetic film is to become the pair of side shield middle layers 193 later. The second magnetic film is to become the pair of second side shield magnetic layers 194 later. The second magnetic film is formed so that the top surface of the second magnetic film is at the same level as the top surface of the magnetic film 56P of the layered film 5P. The top surfaces of the second magnetic film and the layered film 5P are thereby made flat. The subsequent steps are the same as in the first embodiment.

Next, the effects of the MR element according to the present embodiment will be described. In the present embodiment, the first and second side shield magnetic layers 192 and 194 each have the shield function of absorbing an excessive magnetic flux. Of these layers 192 and 194, the second side shield magnetic layers 194 are in contact with and magnetically coupled to the second exchange coupling shield layer 84 (ferromagnetic layer 85). Like the shield-coupling magnetic layers 92 of the first embodiment, the second side shield magnetic layers 194 can thus absorb a larger amount of magnetic flux as compared with the case where they were magnetically isolated from the exchange coupling shield layers 74 and 84. Consequently, according to the present embodiment, a larger amount of magnetic flux can be absorbed by the pair of side shields 191 as compared with the case where the pair of side shields were magnetically isolated from the exchange coupling shield layers 74 and 84. This improves the function of the side shields 191 to absorb an excessive magnetic flux.

In the present embodiment, the directions of magnetization of the side shield magnetic layers 192 and 194, which are antiferromagnetically exchange-coupled to each other via the side shield middle layers 193, are antiparallel to each other. According to the present embodiment, it is thus possible to make the overall magnetization of the side shields 191 smaller. This makes it possible to reduce the impact of the magnetic fields produced by the side shields 191 on the free layers 52 and 54.

In the present embodiment, the direction of magnetization of the first side shield magnetic layers 192 and the direction of magnetization of the second free layer 54 when the second free layer 54 is subjected to no external magnetic field other than the magnetic fields that result from the first and second exchange coupling shield layers 74 and 84 are the same, both being antiparallel to the direction of magnetization of the ferromagnetic layer 85. Consequently, the magnetic fields produced by the first side shield magnetic layers 192 have the same direction as the direction of magnetization of the second free layer 54 when the second free layer 54 is subjected to no external magnetic field other than the magnetic fields that result from the first and second exchange coupling shield layers 74 and 84. If the first side shield magnetic layers 192 here are located at almost the same level as the second free layer 54, the magnetic fields produced by the first side shield magnetic layers 192 function to stabilize the direction of magnetization of the second free layer 54. According to the present embodiment, it is therefore possible to stabilize the direction of magnetization of the second free layer 54.

The remainder of configuration, function and effects of the present embodiment are similar to those of the first embodiment.

Experimental Results

A description will now be given of the results of an experiment that was performed to evaluate the characteristics of the MR elements according to the first and second embodiments and MR elements of first to third comparative examples. Initially, a description will be given of the configuration of five samples of magnetic heads that were used in the experiment, the samples including the MR element according to the first embodiment. The samples differ from each other in the thicknesses of the nonmagnetic layers 90 and the shield-coupling magnetic layers 92. Hereinafter, the five samples including the MR element according to the first embodiment will be referred to as first to fifth samples. In the first to fifth samples, the underlayer 72, the first antiferromagnetic layer 73, the first exchange coupling shield layer 74, and the MR stack 5 have the same configurations as those in the practical example shown in Table 1.

In the first to fifth samples, the ferromagnetic layer 85 of the second exchange coupling shield layer 84 is formed of a stack of two magnetic layers, namely, an NiFe layer and a CoFe layer (Co: 90 atomic %; Fe: 10 atomic %). The NiFe layer is 3 nm thick. The CoFe layer is 2 nm thick. In the first to fifth samples, the second antiferromagnetic layer 83 is formed of a 7-nm-thick IrMn layer.

When fabricating the first to fifth samples, the etching depth in the step shown in FIG. 16 was set to 30 nm. In the first to fifth samples, the pair of insulating layers 4A are each formed of a 5-nm-thick alumina layer.

In the first to fifth samples, the pair of nonmagnetic layers 90 are each formed of a CrTi layer. The shield-coupling magnetic layers 92 are each formed of a NiFe layer. Before the cleaning of the top surfaces of the shield-coupling magnetic layers 92 and the magnetic cap layer 56, the total thickness of the shield-coupling magnetic layer 92 and the nonmagnetic layer 90 was 25 nm. When fabricating the first to fifth samples, the shield-coupling magnetic layers 92 and the magnetic cap layer 56 were subjected to the cleaning with an amount of etching of 2 nm. After the cleaning, the total thickness of the shield-coupling magnetic layer 92 and the nonmagnetic layer 90 was therefore 23 nm.

Table 2 shows the thicknesses of the shield-coupling magnetic layers 92 (side shields 91) and the nonmagnetic layers 90 in the first to fifth samples. In Table 2, the figures in parentheses indicate the thicknesses of the shield-coupling magnetic layers 92 before the cleaning. In the first to fifth samples, the thickness of the nonmagnetic layers 90 was changed in the range of 3 nm to 20 nm. In the first to fifth samples, the thickness of the shield-coupling magnetic layers 92 prior to the cleaning was changed in the range of 5 nm to 22 nm so that the total thickness of the shield-coupling magnetic layer 92 and the nonmagnetic layer 90 was 25 nm before the cleaning. After the cleaning, the shield-coupling magnetic layers 92 therefore had a thickness in the range of 3 to 20 nm. The ratio of the thickness of the shield-coupling magnetic layer 92 to the total thickness of the shield-coupling magnetic layer 92 and the nonmagnetic layer 90 was in the range of 13% to 87% after the cleaning.

TABLE 2

| | Composition Material | Nonmagnetic layer 90 CrTi | Shield-coupling magnetic layer 92 NiFe |
|---|---|---|---|
| Thickness (nm) | First sample | 20 | 3 (5) |
| | Second sample | 18 | 5 (7) |
| | Third sample | 13 | 10 (12) |
| | Fourth sample | 8 | 15 (17) |
| | Fifth sample | 3 | 20 (22) |

The read gap length in the first to fifth samples is 14.6 nm. In the first to fifth samples, the dimension of the MR stack 5 in the track width direction was set to 50 nm.

A description will be given of the configuration of four samples of magnetic heads that were used in the experiment, the samples including the MR element according to the second embodiment. The samples differ from each other in the thicknesses of the nonmagnetic layers 90 and the first side shield magnetic layers 192. Hereinafter, the four samples including the MR element according to the second embodiment will be referred to as sixth to ninth samples. In the sixth to ninth samples, the underlayer 72, the first antiferromagnetic layer 73, the first exchange coupling shield layer 74, the MR stack 5, the second exchange coupling shield layer 84, the second antiferromagnetic layer 83, the nonmagnetic cap layer 82, and the insulating layers 4A have the same configurations as those in the first to fifth samples.

In the sixth to ninth samples, the nonmagnetic layers 90 are each formed of a CrTi layer. The first and second side shield magnetic layers 192 and 194 are each formed of a NiFe layer. The side shield middle layers 193 are each formed of a Ru layer. Before the cleaning of the top surfaces of the second side shield magnetic layers 194 and the magnetic cap layer 56, the total thickness of the nonmagnetic layer 90, the first side shield magnetic layer 192, the side shield middle layer 193 and the second side shield magnetic layer 194 was 24.8 nm. When forming the sixth to ninth samples, the second side shield magnetic layers 194 and the magnetic cap layer 56 were subjected to the cleaning with an amount of etching of 2 nm. After the cleaning, the total thickness of the nonmagnetic layer 90, the first side shield magnetic layer 192, the side shield middle layer 193 and the second side shield magnetic layer 194 was therefore 22.8 nm.

Table 3 shows the thicknesses of the nonmagnetic layers 90, the first side shield magnetic layers 192, the side shield middle layers 193, and the second side shield magnetic layers 194 in the sixth to ninth samples. In Table 3, the figures in parentheses indicate the thicknesses of the second side shield magnetic layers 194 before the cleaning. In the sixth to ninth samples, the thickness of the nonmagnetic layers 90 was changed in the range of 3 nm to 18 nm. In the sixth to ninth samples, the thickness of the first side shield magnetic layers 192 was changed in the range of 2 nm to 17 nm so that the total thickness of the nonmagnetic layer 90, the first side shield magnetic layer 192, the side shield middle layer 193 and the second side shield magnetic layer 194 was 24.8 nm before the cleaning. The second side shield magnetic layers 194 had a thickness of 4 nm before the cleaning. After the cleaning, the second side shield magnetic layers 194 had a thickness of 2 nm.

TABLE 3

| | | Side shield 191 | | | |
|---|---|---|---|---|---|
| | | Non-magnetic layer 90 | First side shield magnetic layer 192 | Side shield middle layer 193 | Second side shield magnetic layer 194 |
| | Composition Material | CrTi | NiFe | Ru | NiFe |
| Thickness (nm) | Sixth sample | 18 | 2 | 0.8 | 2 (4) |
| | Seventh sample | 13 | 7 | 0.8 | 2 (4) |
| | Eighth sample | 8 | 12 | 0.8 | 2 (4) |
| | Ninth sample | 3 | 17 | 0.8 | 2 (4) |

The read gap length in the sixth to ninth samples is 14.6 nm. In the sixth to ninth samples, the dimension of the MR stack 5 in the track width direction was set to 50 nm, as in the first to fifth samples.

A description will now be given of the configuration of a magnetic head sample that was used in the experiment, the sample including an MR element of a first comparative example. Hereinafter, the sample including the MR element of the first comparative example will be referred to as a sample of the first comparative example. The MR element of the first comparative example is a spin-valve MR element. The MR element of the first comparative example therefore includes none of the underlayer 72, the nonmagnetic cap layer 82, the first antiferromagnetic layer 73, the second antiferromagnetic layer 83, the first exchange coupling shield layer 74, the second exchange coupling shield layer 84, the nonmagnetic layers 90, the side shields 91, and the bias magnetic field applying layer 6 of the first and second embodiments. The MR element of the first comparative example has a pair of bias magnetic field applying layers that are disposed on opposite sides of the MR stack of the first comparative example in the track width direction, between the first main shield layer 71 and the second main shield layer 81. The pair of bias magnetic field applying layers adjoin the two side surfaces of the MR stack of the first comparative example via the insulating layers 4A.

The MR stack of the first comparative example includes an underlayer, an antiferromagnetic layer, a first pinned layer, a nonmagnetic middle layer, a second pinned layer, a spacer layer, a free layer, and a nonmagnetic cap layer that are stacked in this order on the first main shield layer 71. In the MR element of the first comparative example, the second main shield layer 81 is stacked over the bias magnetic field applying layers and the nonmagnetic cap layer. The first pinned layer is exchange-coupled to the antiferromagnetic layer, whereby the direction of magnetization of the first pinned layer is pinned. The second pinned layer is antiferromagnetically exchange-coupled to the first pinned layer via the nonmagnetic middle layer. Consequently, the directions of magnetization of the first and second pinned layers are antiparallel to each other, and the direction of magnetization of the second pinned layer is pinned. Table 4 shows the configuration of the MR stack of the first comparative example.

TABLE 4

| Composition of MR stack of first comparative example | | Material | Thickness (nm) |
|---|---|---|---|
| Nonmagnetic cap layer | Nonmagnetic conductive layer | Ta | 2 |
| | Nonmagnetic conductive layer | Ru | 1 |
| Free layer | Magnetic layer | NiFe | 3 |
| | Magnetic layer | CoFeB | 1 |
| | Magnetic layer | $Co_{30}Fe_{70}$ | 1 |
| Spacer layer | | MgO | 3 |
| Second pinned layer | Magnetic layer | $Co_{30}Fe_{70}$ | 1 |
| | Magnetic layer | CoFeB | 1.5 |
| Nonmagnetic middle layer | | Ru | 0.8 |
| First pinned layer | Magnetic layer | $Co_{70}Fe_{30}$ | 3 |
| Antiferromagnetic layer | | IrMn | 7 |
| Underlayer | Nonmagnetic conductive layer | Ru | 2 |
| | Nonmagnetic conductive layer | Ta | 1 |

In the first comparative example, the underlayer is formed of a stack of two nonmagnetic conductive layers, namely, a Ta layer and a Ru layer. The second pinned layer is formed of a stack of two magnetic layers, namely, a CoFeB layer and a CoFe layer (Co: 30 atomic %; Fe: 70 atomic %). The free layer is formed of a stack of three magnetic layers, namely, a CoFe layer (Co: 30 atomic %; Fe: 70 atomic %), a CoFeB layer, and an NiFe layer. The nonmagnetic cap layer is formed of a stack of two nonmagnetic conductive layers, namely, a Ru layer and a Ta layer. In the first comparative example, the spacer layer is made of MgO. The spacer layer is thus a tunnel barrier layer, and therefore the MR stack is a TMR element.

In the first comparative example, the read gap length is the distance from the bottom surface of the Ta layer in the underlayer to the top surface of the Ta layer in the nonmagnetic cap layer, which is 27.3 nm. In the first comparative example, the dimension of the MR stack in the track width direction was set to 50 nm, as in the first to ninth samples.

Figure 20:
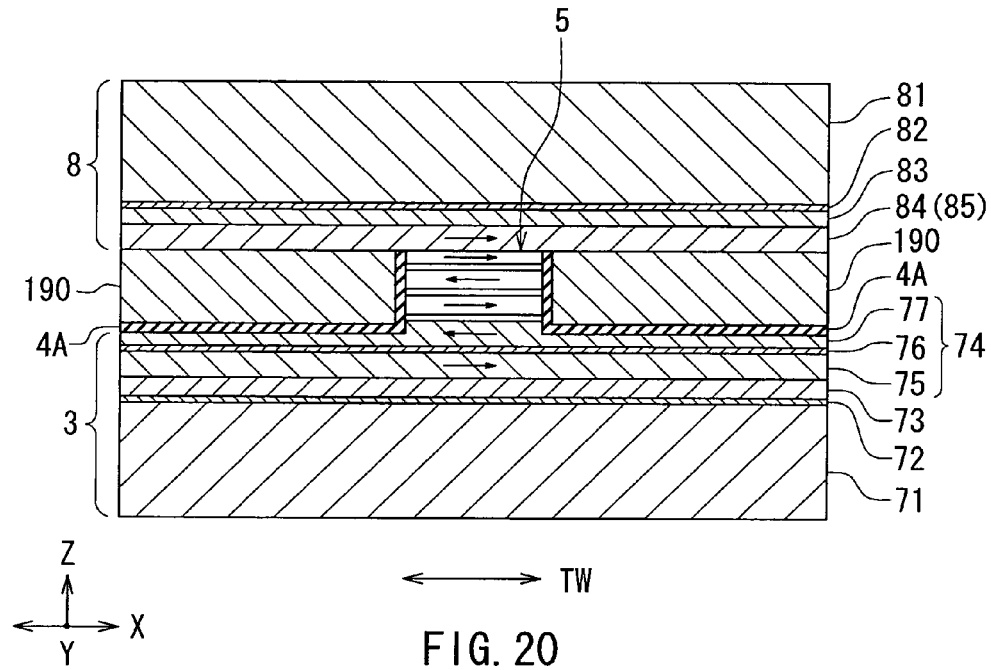
FIG. 20 is a cross-sectional view showing a cross section of a magnetoresistive element of a second comparative example parallel to the medium facing surface.

Now, with reference to FIG. 20, a description will be given of the configuration of a magnetic head sample that was used in the experiment, the sample including an MR element of a second comparative example. Hereinafter, the sample including the MR element of the second comparative example will be referred to as a sample of the second comparative example. FIG. 20 is a cross-sectional view showing a cross section of the MR element of the second comparative example parallel to the medium facing surface 40. The underlayer 72, the first antiferromagnetic layer 73, the first exchange coupling shield layer 74, the MR stack 5, the second exchange coupling shield layer 84, the second antiferromagnetic layer 83, and the insulating layers 4A in the second comparative example have the same configurations as those in the first to ninth samples.

The MR element of the second comparative example has a pair of nonmagnetic layers 190, instead of the pair of nonmagnetic layers 90 and the pair of side shields 91 of the first embodiment. The top surfaces of the nonmagnetic layers 190 and the MR stack 5 are flattened. In the second comparative example, the pair of nonmagnetic layers 190 are each formed of a CrTi layer. Before the cleaning of the top surfaces of the nonmagnetic layers 190 and the magnetic cap layer 56, the nonmagnetic layers 190 had a thickness of 25 nm. When fabricating the sample of the second comparative example, the nonmagnetic layers 190 and the magnetic cap layer 56 were subjected to the cleaning with an amount of etching of 2 nm. After the cleaning, the nonmagnetic layers 190 therefore had a thickness of 23 nm.

The read gap length in the second comparative example is 14.6 nm. In the second comparative example, the dimension of the MR stack 5 in the track width direction was set to 50 nm, as in the first to ninth samples.

Figure 21:
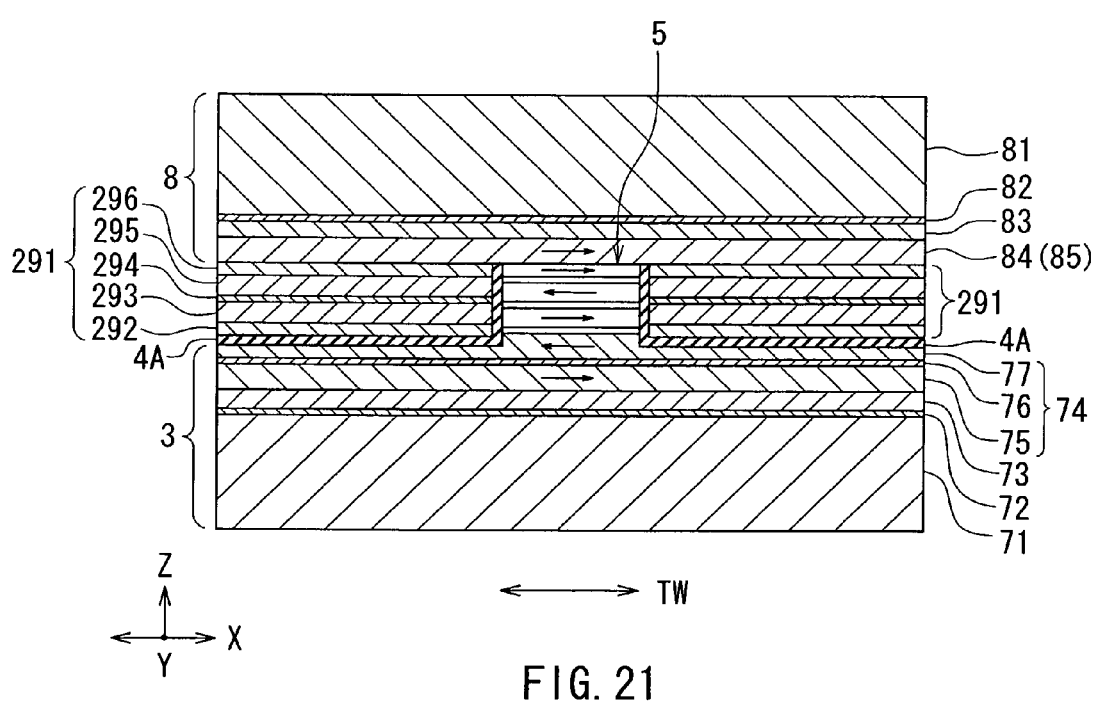
FIG. 21 is a cross-sectional view showing a cross section of a magnetoresistive element of a third comparative example parallel to the medium facing surface.
Figure 22:
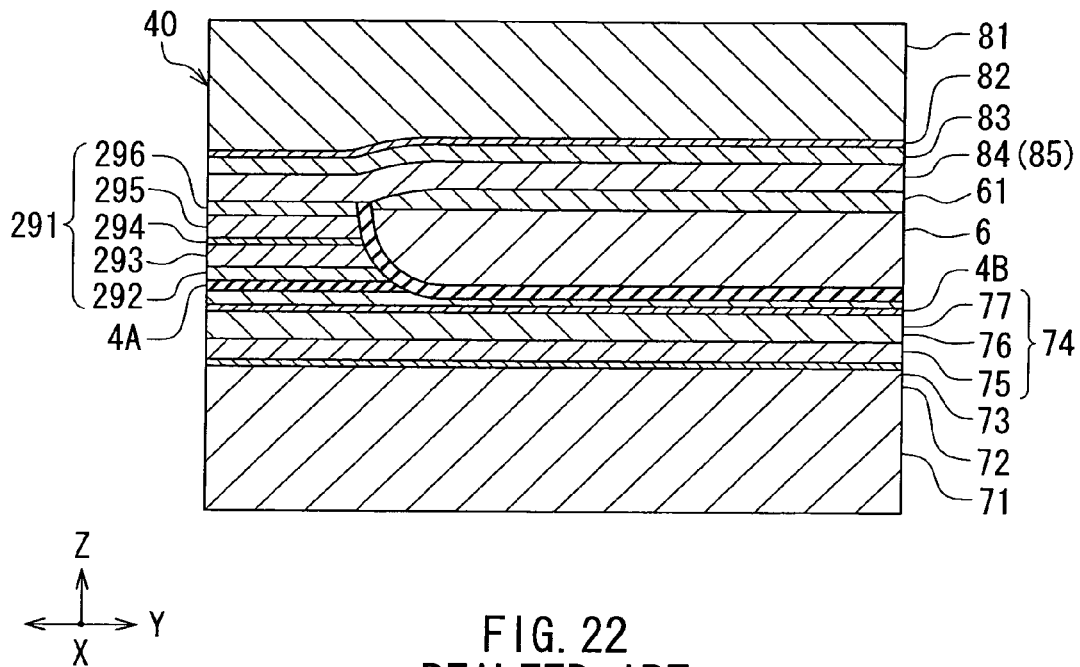
FIG. 22 is a cross-sectional view showing a cross section of the magnetoresistive element of FIG. 21 perpendicular to the medium facing surface and the top surface of the substrate.

Now, with reference to FIG. 21 and FIG. 22, a description will be given of the configuration of a magnetic head sample that was used in the experiment, the sample including an MR element of a third comparative example. Hereinafter, the sample including the MR element of the third comparative example will be referred to as a sample of the third comparative example. FIG. 21 is a cross-sectional view showing a cross section of the MR element of the third comparative example parallel to the medium facing surface 40. FIG. 22 shows a cross section of the MR element shown in FIG. 21 perpendicular to the medium facing surface 40 and the top surface of the substrate 1. Note that FIG. 22 shows the cross section of the MR element at the position corresponding to the position of the line 4-4 of FIG. 2. The underlayer 72, the first antiferromagnetic layer 73, the first exchange coupling shield layer 74, the MR stack 5, the second exchange coupling shield layer 84, the second antiferromagnetic layer 83, and the insulating layers 4A in the third comparative example have the same configurations as those in the first to ninth samples.

The MR element of the third comparative example has a pair of side shields 291, instead of the pair of nonmagnetic layers 90 and the pair of side shields 91 of the first embodiment. Each of the pair of side shields 291 includes an underlayer 292, a first side shield magnetic layer 293, a side shield middle layer 294, a second side shield magnetic layer 295, and a nonmagnetic cap layer 296 that are stacked in this order on the first insulating layer 4A. The top surfaces of the nonmagnetic cap layers 296 and the MR stack 5 are flattened. The first side shield magnetic layers 293 are antiferromagnetically exchange-coupled to the second side shield magnetic layers 295 via the side shield middle layers 294. The first and second side shield magnetic layers 293 and 295 each have the shield function of absorbing an excessive magnetic flux. The underlayers 292 and the nonmagnetic cap layers 296 are each formed of a nonmagnetic metal material. In the third comparative example, the side shield magnetic layers 293 and 295 are thus magnetically isolated from the exchange coupling shield layers 74 and 84.

Specifically, in the third comparative example, the underlayers 292 and the nonmagnetic cap layers 296 are each formed of a CrTi layer. The underlayers 292 have a thickness of 5 nm. After the cleaning of the top surfaces of the nonmagnetic cap layers 296 and the magnetic cap layer 56, the nonmagnetic cap layers 296 had a thickness of 5 nm. In the third comparative example, the first side shield magnetic layers 293 are each formed of a stack of a 5-nm-thick NiFe layer and a 1-nm-thick CoFe layer. The second side shield magnetic layers 295 are each formed of a stack of a 1-nm-thick CoFe layer and a 5-nm-thick NiFe layer. The first and second side shield magnetic layers 293 and 295 each have a thickness of 6 nm. In the third comparative example, the side shield middle layers 294 are each formed of a 0.8-nm-thick Ru layer.

The read gap length in the third comparative example is 14.6 nm. In the third comparative example, the dimension of the MR stack 5 in the track width direction was set to 50 nm, as in the first to ninth samples.

Next, the details of the experiment will be described. In the experiment, the first to ninth samples and the samples of the first to third comparative examples were evaluated for electromagnetic transducing characteristics. The electromagnetic transducing characteristics are the characteristics of the MR element that are exhibited when the MR element detects a signal magnetic field sent from a recording medium while the magnetic head including the MR element is made to fly over the surface of the recording medium by using a head gimbal assembly. In the experiment, the samples were evaluated for read output, one of the electromagnetic transducing characteristics. Here, the read output will be defined as a difference between the maximum value and the minimum value (peak-to-peak value) of an isolated waveform in the waveform of the output voltage (hereinafter, referred to as read output waveform) of the MR element under the application of a signal magnetic field having any amplitude with alternately-switching positive and negative polarities.

The experiment also evaluated the MR elements for resolution. The resolution is a parameter that indicates the frequency dependence of the read output. In the experiment, the resolution was defined and determined as the value of the read output when reading a signal of 190-MHz frequency, divided by the read output when reading a signal of isolated waveform.

Figure 23:
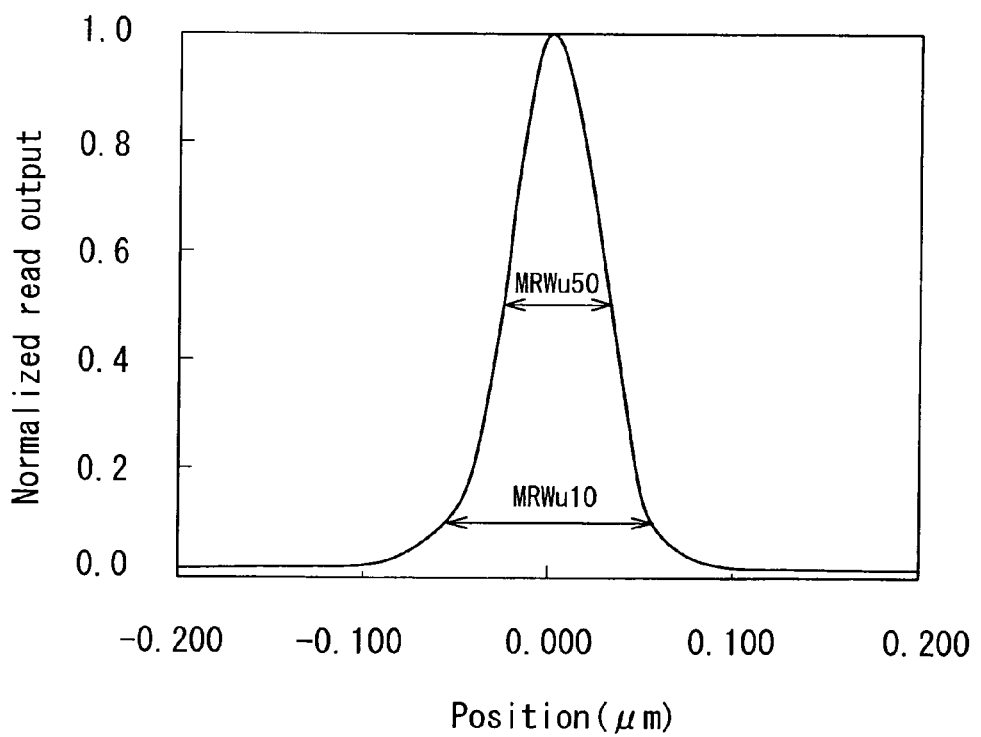
FIG. 23 is a characteristic chart showing an example of a micro-track profile.

The experiment also evaluated the effect of the side shields by using a micro-track profile as described below. Hereinafter, the method of creating a micro-track profile will be described. Initially, a track having a width smaller than the dimension of the MR stack in the track width direction (hereinafter, referred to as a micro-track) is formed on a recording medium. The micro-track is formed by shifting the magnetic head off the center of a signal-recorded track in the track width direction, thereby erasing the signal in either one or both side areas of the track. The micro-track has a width of 10 nm, for example. Next, the position of the magnetic head with respect to the micro-track is changed in the track width direction to determine the read outputs at respective positions. A micro-track profile is thereby created which shows the relationship between the position of the magnetic head in the track width direction and the read output. FIG. 23 shows an example of the micro-track profile. In FIG. 23, the horizontal axis indicates the position of the magnetic head, and the vertical axis indicates the normalized read output. The normalized read output is the value of the read output in each position, divided by the maximum value of the read output. In FIG. 23, the position 0 indicates that the center of the MR stack in the track width direction coincides with the center of the micro-track in the track width direction.

The effect of the side shields can be evaluated from the sharpness of the micro-track profile. More specifically, the smaller the spread of the micro-track profile is and the sharper the micro-track profile is, the narrower the effective track width can be made and the higher the effect of the side shields can be said to be. In the experiment, the sharpness of the micro-track profile was defined and determined as the value of the distance (hereinafter, referred to as MRWu50) between two points that showed a read output 50% the maximum value of the read output in the micro-track profile, divided by the distance (hereinafter, referred to as MRWu10) between two points that showed a read output 10% the maximum value of the read output. MRWu50 and MRWu10 are also shown in FIG. 23. It can be said that the higher the sharpness of the micro-track profile thus defined is, the higher the effect of the side shields is.

Table 5 shows the results of the experiment on the first to ninth samples and the samples of the first to third comparative examples. In Table 5, the resolution and the sharpness of the micro-track profile are expressed in percentage.

TABLE 5

| Electromagnetic transducing characteristics | Read output (mV) | Resolution (%) | Sharpness (%) |
|---|---|---|---|
| Sample of first comparative example | 14 | 45 | 52 |
| Sample of second comparative example | 14 | 48 | 52 |
| Sample of third comparative example | 14 | 48 | 60 |
| First sample | 14 | 48 | 60 |
| Second sample | 14 | 48 | 63 |
| Third sample | 14 | 48 | 64 |
| Fourth sample | 14 | 48 | 64 |
| Fifth sample | 13 | 48.5 | 65 |
| Sixth sample | 14 | 48 | 58 |
| Seventh sample | 14 | 48 | 60 |
| Eighth sample | 14 | 48 | 62 |
| Ninth sample | 14 | 48 | 62 |

As shown in Table 5, all the samples other than the fifth sample showed a read output of 14 mV. The reason for this seems to be that the spacer layer 54, which contributes most to the read output in the MR stack 5, and the adjoining two magnetic layers have the same configuration in all the samples. The reason why the fifth sample is lower in read output than the other samples seems to be that the shield-coupling magnetic layers 92 of great thickness absorb some of the signal magnetic field.

As shown in Table 5, the sample of the first comparative example showed a resolution of 45%, and the fifth sample 48.5%. All the samples other than the sample of the first comparative example and the fifth sample showed a resolution of 48%. The reason why the samples of the second and third comparative examples and the first to ninth samples are higher in resolution than the sample of the first comparative example seems to be that the samples of the second and third comparative examples and the first to ninth samples are smaller in read gap length than the sample of the first comparative example.

As shown in Table 5, the samples of the first and second comparative examples with no side shield showed a micro-track profile sharpness of 52%. In contrast, the sample of the third comparative example and the first to ninth samples with side shields showed a micro-track profile sharpness higher than that of the samples of the first and second comparative examples. From such a result, it can be seen that the side shields contribute to an increase in sharpness of the micro-track profile, i.e., a reduction in effective track width.

When comparison is made between the first to fifth samples which include the MR element according to the first embodiment, the sharpness of the micro-track profile increases as the thickness of the shield-coupling magnetic layers 92 increases. From the result, it is considered that in the MR element according to the first embodiment, the effect of the side shields 91 increases as the thickness of the shield-coupling magnetic layers 92 increases. It should be noted, however, that the read output of the fifth sample is slightly lower than the read output of the first to fourth samples. This shows that the shield-coupling magnetic layers 92 of excessive thickness cause an undesirable drop in the read output. As compared with the first to fourth samples, the fifth sample is slightly lower in read output, but higher in resolution and micro-track profile sharpness. In view of these facts, the fifth sample is considered to be useful. Increasing the thickness of the shield-coupling magnetic layers 92 beyond that in the fifth sample is undesirable, however, since it would cause a drop in read output.

On the other hand, if the shield-coupling magnetic layers 92 are too small in thickness, the side shields 91 will not provide a sufficient effect. The first sample has the same characteristics as those of the sample of the third comparative example. The thickness of the shield-coupling magnetic layers 92 in the first sample can thus be considered as the lower limit of the thickness of the shield-coupling magnetic layers 92.

The ratio of the thickness of the shield-coupling magnetic layer 92 to the total thickness of the shield-coupling magnetic layer 92 and the nonmagnetic layer 90 is 13% in the first sample, and 87% in the fifth sample. It is therefore preferred in the first embodiment that the ratio of the thickness of the shield-coupling magnetic layer 92 to the total thickness of the shield-coupling magnetic layer 92 and the nonmagnetic layer 90 fall within the range of 13% to 87%.

As compared with the sample of the third comparative example, the second to fourth samples have the same read output and the same resolution with a higher micro-track profile sharpness. The ratio of the thickness of the shield-coupling magnetic layer 92 to the total thickness of the shield-coupling magnetic layer 92 and the nonmagnetic layer 90 is 22% in the second sample, and 65% in the fourth sample. Consequently, in the first embodiment, it is more preferred that the ratio of the thickness of the shield-coupling magnetic layer 92 to the total thickness of the shield-coupling magnetic layer 92 and the nonmagnetic layer 90 fall within the range of 22% to 65%.

As compared with the samples of the first and second comparative examples having no side shield, the sixth to ninth samples including the MR element according to the second embodiment are higher in micro-track profile sharpness. It can thus be seen that the effect of the side shields 191 is exerted also in the second embodiment. Note that in the second embodiment, only the side shield magnetic layers 194 between the two types of side shield magnetic layers 192 and 194 are in contact with and magnetically coupled to the second exchange coupling shield layer 84 (ferromagnetic layer 85). The effect of the side shields is therefore weaker as compared with the first embodiment. The weaker effect manifests itself as the not-so-high sharpness of the micro-track profiles of the sixth to ninth samples. Nevertheless, as compared with the sample of the third comparative example, the eighth and ninth samples have the same read output and the same resolution with a higher micro-track profile sharpness. This shows that the second embodiment can also improve the function of the side shields 191 as compared with the case where the side shields are magnetically isolated from the exchange coupling shield layers 74 and 84.

In the second embodiment, as mentioned previously, the magnetic fields produced by the first side shield magnetic layers 192 have the same direction as the direction of magnetization of the second free layer 54 when the second free layer 54 is subjected to no external magnetic field other than the magnetic fields that result from the first and second exchange coupling shield layers 74 and 84. This makes it possible to stabilize the direction of magnetization of the second free layer 54 by using the magnetic fields produced by the first side shield magnetic layers 192. Such an effect is not available in the third comparative example where the side shield magnetic layers 293 and 295 are magnetically isolated from the exchange coupling shield layers 74 and 84.

Third Embodiment

Figure 24:
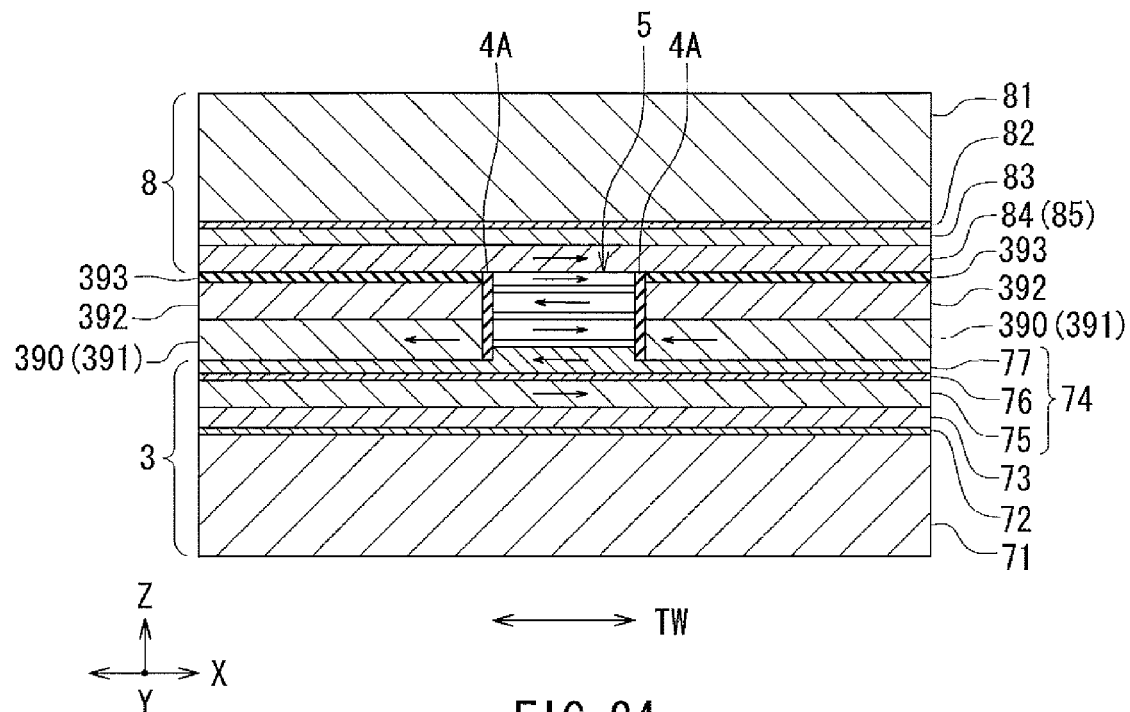
FIG. 24 is a cross-sectional view showing a cross section of a magnetoresistive element according to a third embodiment of the invention parallel to the medium facing surface.

A third embodiment of the invention will now be described with reference to FIG. 24. FIG. 24 is a cross-sectional view showing a cross section of the MR element according to the present embodiment parallel to the medium facing surface. The MR element according to the present embodiment has a pair of side shields 390, a pair of nonmagnetic layers 392, and a pair of insulating layers 393, instead of the pair of nonmagnetic layers 90 and the pair of side shields 91 of the first embodiment.

The pair of side shields 390 are disposed on opposite sides of the MR stack 5 in the track width direction TW. In the present embodiment, the pair of insulating layers 4A respectively have openings for exposing part of the top surface of the first exchange coupling shield layer 74 (ferromagnetic layer 77). The pair of side shields 390 respectively have shield-coupling magnetic layers 391 that are in contact with and magnetically coupled to the ferromagnetic layer 77 of the first exchange coupling shield layer 74 through the openings of the insulating layers 4A. In the present embodiment, in particular, the side shields 390 are composed only of the shield-coupling magnetic layers 391. The ferromagnetic layer 77 and the shield-coupling magnetic layers 391 have the same direction of magnetization parallel to the track width direction TW. The shield-coupling magnetic layers 391 are made of a soft magnetic material such as NiFe, CoFe, CoFeB, CoFeNi, or FeN. The shield-coupling magnetic layers 391 have the shield function of absorbing an excessive magnetic flux.

The pair of nonmagnetic layers 392 are disposed on the pair of side shields 390 on opposite sides of the MR stack 5 in the track width direction TW. The pair of insulating layers 393 are disposed on the pair of nonmagnetic layers 392 on opposite sides of the MR stack 5 in the track width direction TW. The pair of side shields 390, the pair of nonmagnetic layers 392, and the pair of insulating layers 393 are all disposed on opposite sides of the MR stack 5 in the track width direction TW, between the first main shield portion 3 and the second main shield portion 8, and adjoin the two side surfaces of the MR stack 5 via the insulating layers 4A. The pair of insulating layers 393 are interposed between the second exchange coupling shield layer 84 (ferromagnetic layer 85) and the pair of side shields 390 (shield-coupling magnetic layers 391). The top surfaces of the pair of insulting layers 393 and the MR stack 5 are flattened. The nonmagnetic layers 392 are made of a nonmagnetic metal material. The nonmagnetic layers 392 may be made of a material selected from the group consisting of Cr, CrTi, and Ru. The insulating layers 393 are made of an insulating material such as alumina.

Next, a method of manufacturing the MR element according to the present embodiment will be described. The method of manufacturing the MR element according to the present embodiment is the same as the method according to the first embodiment up to the step of etching the layered film 5P and the magnetic layer 77P in part as shown in FIG. 16. In the present embodiment, after etching the layered film 5P and the magnetic layer 77P in part, an insulating film 4AP is formed over the entire top surface of the stack by, for example, sputtering, with the mask 93 used for patterning the layered film 5P left intact. Next, the insulating film 4AP is selectively etched to form two openings for exposing part of the top surface of the magnetic layer 77P at opposite sides of the layered film 5P in the track width direction TW. Next, with the mask 93 left intact, a magnetic film, a nonmagnetic film, and an insulating film are formed in succession over the entire top surface of the stack by sputtering, for example. The magnetic film is to become the pair of shield-coupling magnetic layers 391 later. The nonmagnetic film is to become the pair of nonmagnetic layers 392 later. The insulating film is to become the pair of insulating layers 393 later. The insulating film is formed so that the top surface of the insulating film is at the same level as the top surface of the magnetic film 56P of the layered film 5P. The top surfaces of the insulating film and the layered film 5P are thereby made flat. The subsequent steps are the same as in the first embodiment.

In the first embodiment, each of the pair of side shields 91 has the shield-coupling magnetic layer 92 which is in contact with and magnetically coupled to the second exchange coupling shield layer 84 (ferromagnetic layer 85). In contrast, in the present embodiment, each of the pair of side shields 390 has the shield-coupling magnetic layer 391 which is in contact with and magnetically coupled to the first exchange coupling shield layer 74 (ferromagnetic layer 77). In the present embodiment, the magnetic flux absorbed by the shield-coupling magnetic layers 391 flows to the ferromagnetic layer 77 of high volume. According to the present embodiment, like the first embodiment, a larger amount of magnetic flux can thus be absorbed by the pair of side shields 390 (shield-coupling magnetic layers 391) as compared with the case where the pair of side shields were magnetically isolated from the exchange coupling shield layers 74 and 84. Consequently, the function of the side shields 390 is improved.

The remainder of configuration, function and effects of the present embodiment are similar to those of the first embodiment.

As can be seen from the first and third embodiments, according to the present invention, each the pair of side shields need only have at least one shield-coupling magnetic layer that is in contact with and magnetically coupled to either one of the first and second exchange coupling shield layers.

The present embodiment may be modified so that the MR element of the invention is configured as in the following modification example. In this modification example, the pair of side shields 390 of the present embodiment are replaced with the pair of side shields 191 of the second embodiment. In such a case, the pair of first side shield magnetic layers 192 of the pair of side shields 191 are in contact with and magnetically coupled to the first exchange coupling shield layer 74 (ferromagnetic layer 77). This modification example provides the same effects as those of the second embodiment.

Fourth Embodiment

Figure 25:
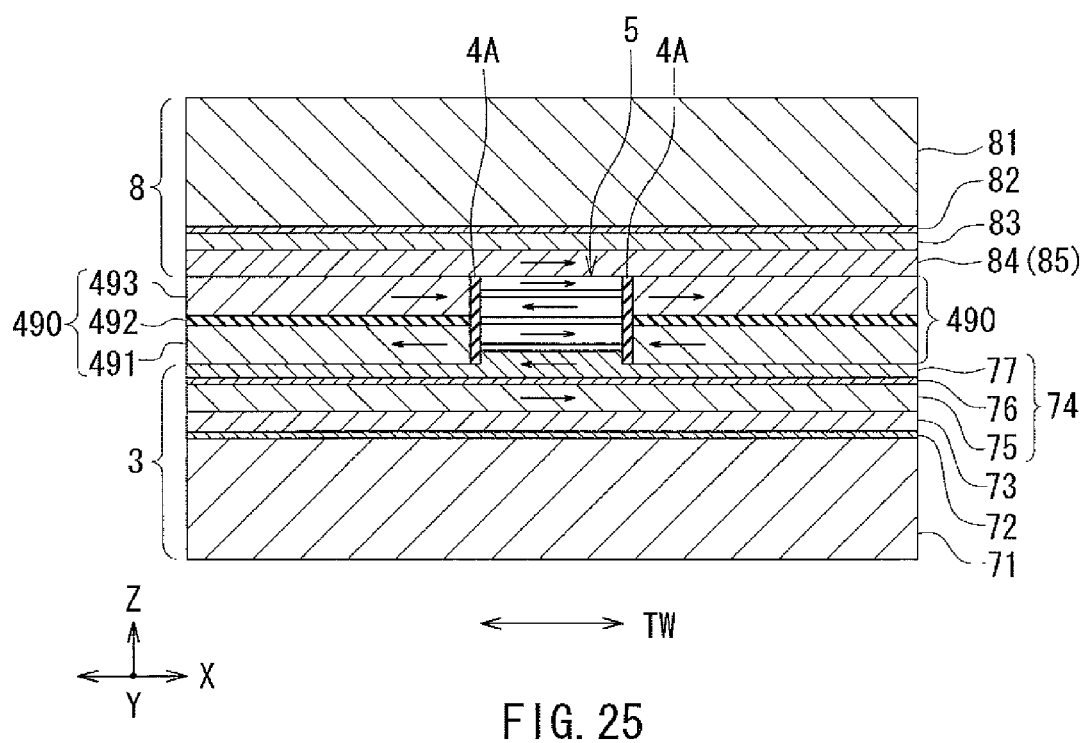
FIG. 25 is a cross-sectional view showing a cross section of a magnetoresistive element according to a fourth embodiment of the invention parallel to the medium facing surface.

A fourth embodiment of the invention will now be described with reference to FIG. 25. FIG. 25 is a cross-sectional view showing a cross section of the MR element according to the present embodiment parallel to the medium facing surface. The MR element according to the present embodiment has a pair of side shields 490, instead of the pair of side shields 391, the pair of nonmagnetic layers 392 and the pair of insulating layers 393 of the third embodiment. The pair of side shields 490 are disposed on opposite sides of the MR stack 5 in the track width direction TW, between the first main shield portion 3 and the second main shield portion 8. The side shields 490 adjoin the two side surfaces of the MR stack 5 via the insulating layers 4A.

Each of the pair of side shields 490 includes first and second side shield magnetic layers 491 and 493, and a side shield insulating layer 492 disposed between the first and second side shield magnetic layers 491 and 493. The first side shield magnetic layer 491, the side shield insulating layer 492, and the second side shield magnetic layer 493 are stacked in this order on the first exchange coupling shield layer 74. The top surfaces of the second side shield magnetic layers 493 and the MR stack 5 are flattened.

The first side shield magnetic layers 491 are in contact with and magnetically coupled to the first exchange coupling shield layer 74 (ferromagnetic layer 77) through the openings of the insulating layers 4A. The second side shield magnetic layers 493 are in contact with and magnetically coupled to the second exchange coupling shield layer 84 (ferromagnetic layer 85). In the present embodiment, both the first and second side shield magnetic layers 491 and 493 correspond to the shield-coupling magnetic layer of the present invention.

The ferromagnetic layer 77 and the first side shield magnetic layers 491 have the same direction of magnetization. The ferromagnetic layer 85 and the second side shield magnetic layers 493 have the same direction of magnetization. The directions of magnetization of the ferromagnetic layers 77 and 85 are antiparallel to each other. Therefore, the directions of magnetization of the first and second side shield magnetic layers 491 and 493 are also antiparallel to each other.

The first and second side shield magnetic layers 491 and 493 are each made of a soft magnetic material such as NiFe, CoFe, CoFeB, CoFeNi, or FeN. The first and second side shield magnetic layers 491 and 493 each have the shield function of absorbing an excessive magnetic flux. The side shield insulating layers 492 are made of an insulating material such as alumina.

A method of manufacturing the MR element according to the present embodiment will now be described. The method of manufacturing the MR element according to the present embodiment is the same as the method according to the third embodiment up to the step of forming two openings in the insulating film 4AP for exposing part of the top surface of the magnetic layer 77P. In the present embodiment, after the two openings are formed in the insulating film 4AP, a first magnetic film, an insulating film, and a second magnetic film are formed in succession over the entire top surface of the stack by, for example, sputtering, with the mask 93 (see FIG. 16) used for patterning the layered film 5P left intact. The first magnetic film is to become the pair of first side shield magnetic layers 491 later. The insulating film is to become the pair of side shield insulating layers 492 later. The second magnetic film is to become the pair of second side shield magnetic layers 493 later. The second magnetic film is formed so that the top surface of the second magnetic film is at the same level as the top surface of the magnetic film 56P of the layered film 5P. The top surfaces of the second magnetic film and the layered film 5P are thereby made flat. The subsequent steps are the same as in the third embodiment.

According to the present embodiment, both the first and second side shield magnetic layers 491 and 493 can be used to improve the function of the pair of side shields 490 to absorb an excessive magnetic flux in the track width direction TW of the MR stack 5.

In the present embodiment, the directions of magnetization of the first and second side shield magnetic layers 491 and 493 are antiparallel to each other like the first and second side shield magnetic layers 192 and 194 of the second embodiment. According to the present embodiment, it is thus possible to make the overall magnetization of the side shields 490 smaller. This makes it possible to reduce the impact of the magnetic fields produced by the side shields 490 on the free layers 52 and 54.

The remainder of configuration, function and effects of the present embodiment are similar to those of the third embodiment.

The present invention is not limited to the foregoing embodiments, and various modifications may be made thereto. For example, the foregoing embodiments have dealt with the cases where the spacer layer is a tunnel barrier layer. However, in the present invention, the spacer layer may be a nonmagnetic conductive layer, or a current-confined-path spacer layer which includes a current-transmitting portion and a current-blocking portion.

While the foregoing embodiments have been described with reference to a magnetic head having a structure in which the read head is formed on the base body and the write head is stacked on the read head, the read head and the write head may be stacked in the reverse order. If the magnetic head is to be used only for read operations, the magnetic head may be configured to include the read head only.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A magnetoresistive element intended for detecting a magnetic signal written on a track of a recording medium, comprising:
   a first main shield portion and a second main shield portion; and
   an MR stack disposed between the first and second main shield portions, wherein:
   the first main shield portion, the MR stack, and the second main shield portion are arranged in a direction in which the track extends;
   the first main shield portion includes: a first main shield layer; a first antiferromagnetic layer that is disposed between the first main shield layer and the MR stack; and a first exchange coupling shield layer that is disposed between the first antiferromagnetic layer and the MR stack and is exchange-coupled to the first antiferromagnetic layer;
   the second main shield portion includes: a second main shield layer; a second antiferromagnetic layer that is disposed between the second main shield layer and the MR stack; and a second exchange coupling shield layer that is disposed between the second antiferromagnetic layer and the MR stack and is exchange-coupled to the second antiferromagnetic layer;
   the MR stack includes: a spacer layer made of a nonmagnetic material; a first free layer disposed between the first exchange coupling shield layer and the spacer layer; and a second free layer disposed between the second exchange coupling shield layer and the spacer layer;
   the first free layer is magnetically coupled to the first exchange coupling shield layer, whereby a direction of magnetization of the first free layer is controlled; and
   the second free layer is magnetically coupled to the second exchange coupling shield layer, whereby a direction of magnetization of the second free layer is controlled,
   the magnetoresistive element further comprising a pair of side shields disposed on opposite sides of the MR stack in a track width direction, between the first main shield portion and the second main shield portion,
   wherein each of the pair of side shields includes at least one shield-coupling magnetic layer that is in contact with and magnetically coupled to one of the first and second exchange coupling shield layers.

2. The magnetoresistive element according to claim 1, wherein the MR stack and the second main shield portion are stacked in this order on the first main shield portion,
   the magnetoresistive element further comprising a pair of insulating layers disposed between the first exchange coupling shield layer and the pair of side shields,
   wherein the at least one shield-coupling magnetic layer is in contact with and magnetically coupled to the second exchange coupling shield layer.

3. The magnetoresistive element according to claim 2, wherein top surfaces of the at least one shield-coupling magnetic layer and the MR stack are flattened.

4. The magnetoresistive element according to claim 3, further comprising a pair of nonmagnetic layers disposed between the at least one shield-coupling magnetic layer and the pair of insulating layers.

5. The magnetoresistive element according to claim 4, wherein the at least one shield-coupling magnetic layer is made of NiFe, and the nonmagnetic layers are made of a material selected from the group consisting of Cr, CrTi, and Ru.

6. The magnetoresistive element according to claim 4, wherein a ratio of a thickness of the shield-coupling magnetic layer to a total thickness of the shield-coupling magnetic layer and the nonmagnetic layer is in the range of 13% to 87%.

7. The magnetoresistive element according to claim 1, wherein the MR stack and the second main shield portion are stacked in this order on the first main shield portion,
   the magnetoresistive element further comprising a pair of insulating layers disposed between the second exchange coupling shield layer and the pair of side shields,
   wherein the at least one shield-coupling magnetic layer is in contact with and magnetically coupled to the first exchange coupling shield layer.

8. The magnetoresistive element according to claim 1, wherein:
   each of the pair of side shields includes a side shield middle layer that is made of a nonmagnetic conductive material, and first and second side shield magnetic layers that are antiferromagnetically exchange-coupled to each other via the side shield middle layer; and
   one of the first and second side shield magnetic layers is the at least one shield-coupling magnetic layer.

9. The magnetoresistive element according to claim 8, wherein the MR stack and the second main shield portion are stacked in this order on the first main shield portion,
- the magnetoresistive element further comprising a pair of insulating layers disposed between the first exchange coupling shield layer and the pair of side shields,
- wherein the side shield middle layer and the second side shield magnetic layer are stacked in this order on the first side shield magnetic layer, and
- the second side shield magnetic layer is the at least one shield-coupling magnetic layer, and is in contact with and magnetically coupled to the second exchange coupling shield layer.

10. The magnetoresistive element according to claim 1, wherein:
- each of the pair of side shields includes first and second side shield magnetic layers, and a side shield insulating layer that is disposed between the first and second side shield magnetic layers;
- both of the first and second side shield magnetic layers are the at least one shield-coupling magnetic layer;
- the first side shield magnetic layer is in contact with and magnetically coupled to the first exchange coupling shield layer; and
- the second side shield magnetic layer is in contact with and magnetically coupled to the second exchange coupling shield layer.

11. The magnetoresistive element according to claim 1, wherein:
- one of the first and second exchange coupling shield layers includes a shield middle layer that is made of a nonmagnetic conductive material, and two ferromagnetic layers that are antiferromagnetically exchange-coupled to each other via the shield middle layer; and
- the other of the first and second exchange coupling shield layers includes one or more ferromagnetic layers and no shield middle layer.

12. A thin-film magnetic head comprising the magnetoresistive element according to claim 1, the thin-film magnetic head having a medium facing surface that faces the recording medium, the magnetoresistive element being disposed near the medium facing surface.

13. A head assembly comprising a slider, and a supporter that flexibly supports the slider, wherein the slider includes the thin-film magnetic head according to claim 12 and is disposed to face the recording medium.

14. A magnetic recording device comprising the thin-film magnetic head according to claim 12, the recording medium, and a positioning device that supports the thin-film magnetic head and positions the thin-film magnetic head with respect to the recording medium.

15. A method of manufacturing the magnetoresistive element according to claim 1, comprising the steps of:
- forming the first main shield portion;
- forming the MR stack and the pair of side shields after the formation of the first main shield portion; and
- forming the second main shield portion after the formation of the MR stack and the pair of side shields.

16. The method according to claim 15, wherein:
- the magnetoresistive element further comprises a pair of insulating layers disposed between the first exchange coupling shield layer and the pair of side shields;
- the at least one shield-coupling magnetic layer is in contact with and magnetically coupled to the second exchange coupling shield layer; and
- the step of forming the MR stack and the pair of side shields includes the step of forming the pair of insulating layers and the step of flattening top surfaces of the at least one shield-coupling magnetic layer and the MR stack.

17. The method according to claim 16, wherein:
- the magnetoresistive element further comprises a pair of nonmagnetic layers disposed between the at least one shield-coupling magnetic layer and the pair of insulating layers; and
- the step of forming the MR stack and the pair of side shields further includes the step of forming the pair of nonmagnetic layers.

* * * * *